(12) United States Patent
Yoo et al.

(10) Patent No.: US 11,244,959 B2
(45) Date of Patent: Feb. 8, 2022

(54) SEMICONDUCTOR DEVICE HAVING FERROELECTRIC MATERIAL AND METHOD OF FABRICATING THE SAME

(71) Applicant: SK hynix Inc., Icheon-si (KR)

(72) Inventors: Hyangkeun Yoo, Icheon-si (KR); Jae Gil Lee, Icheon-si (KR); Se Ho Lee, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 244 days.

(21) Appl. No.: 16/421,081

(22) Filed: May 23, 2019

(65) Prior Publication Data

US 2020/0119047 A1  Apr. 16, 2020

(30) Foreign Application Priority Data

Oct. 11, 2018 (KR) .................. 10-2018-0121381

(51) Int. Cl.
*H01L 29/51* (2006.01)
*H01L 27/11597* (2017.01)
*H01L 27/1159* (2017.01)
*H01L 21/28* (2006.01)

(52) U.S. Cl.
CPC .... *H01L 27/11597* (2013.01); *H01L 27/1159* (2013.01); *H01L 29/40111* (2019.08); *H01L 29/516* (2013.01)

(58) Field of Classification Search
CPC ............ H01L 29/516; H01L 27/11585; H01L 27/11597
See application file for complete search history.

(56) References Cited

U.S. PATENT DOCUMENTS 9,362,487 B2 * 6/2016 Inumiya ................ H01L 29/516

FOREIGN PATENT DOCUMENTS

KR 10-2018-0131118 A 12/2018

* cited by examiner

*Primary Examiner* — Mark V Prenty

(57) ABSTRACT

A semiconductor device is provided. The semiconductor device includes a substrate, an electrode stack disposed on the substrate, the electrode stack including an interlayer insulation layer and a gate electrode structure that are alternately stacked in a direction perpendicular to the substrate, a trench penetrating the electrode stack to expose sidewall surfaces of the interlayer insulation layer and the gate electrode structure, a gate dielectric layer disposed along a sidewall surface of the trench, the gate dielectric layer including a ferroelectric portion and a non-ferroelectric portion, and a channel layer disposed to adjacent to the gate dielectric layer. The ferroelectric portion is in contact with the gate electrode structure, and the non-ferroelectric portion is in contact with the interlayer insulation layer.

7 Claims, 31 Drawing Sheets

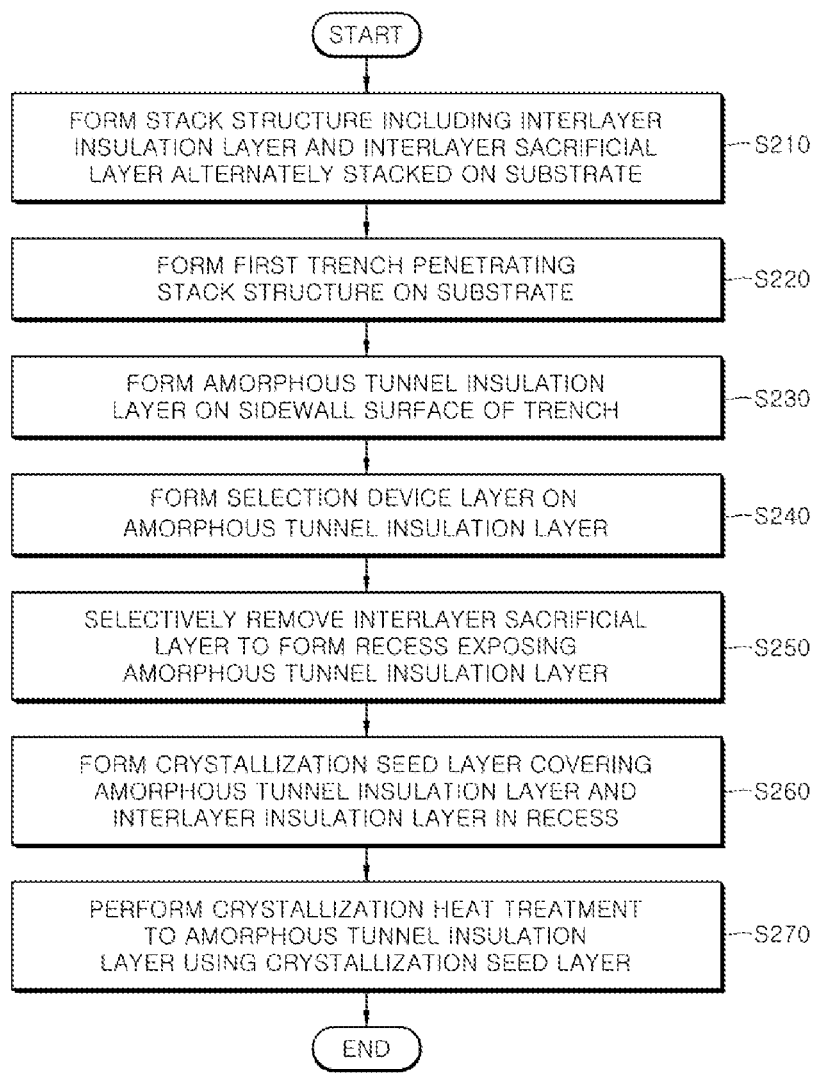

SEMICONDUCTOR DEVICE HAVING FERROELECTRIC MATERIAL AND METHOD OF FABRICATING THE SAME

CROSS-REFERENCE TO RELATED APPLICATION

The present application claims priority under 35 U.S.C. 119(a) to Korean Patent Application No. 10-2018-0121381, filed on Oct. 11, 2018, which is herein incorporated by reference in its entirety.

BACKGROUND

1. Technical Field

Various embodiments of the present disclosure generally relate to a semiconductor device and, more particularly, to a semiconductor device having a ferroelectric material and a method of fabricating the same.

2. Related Art

Recently, a semiconductor device for recording signal information by changing electrical resistance of a thin film has been developed. The resistance state of an internal memory element of the semiconductor device is reversibly changed according to an externally applied current or voltage, and the changed resistance state can be stored in a non-volatile manner as electrical signal information. The nonvolatile storing device may include, for example, a magnetic random access memory (MRAM), a phase change random access memory (PCRAM), a resistive random access memory (ReRAM), a ferroelectric memory and the like.

Meanwhile, as the design rule decreases and the degree of integration increases, research on the structures of semiconductor devices that can improve or even guarantee both the structural stability and the reliability of storage operations has continued. Recently, as a result of such research, a three-dimensional storage cell structure has been proposed.

SUMMARY

An embodiment of the present disclosure provides a semiconductor device comprising a ferroelectric material, which can ensure structural stability and operational reliability.

An embodiment of the present disclosure provides a method of manufacturing semiconductor device having a ferroelectric material described above.

A semiconductor device according to the present disclosure may include a substrate, an electrode stack disposed on the substrate, the electrode stack including an interlayer insulation layer and a gate electrode structure that are alternately stacked in a direction perpendicular to the substrate, a trench penetrating the electrode stack to expose sidewall surfaces of the interlayer insulation layer and the gate electrode structure, a gate dielectric layer disposed along a sidewall surface of the trench, the gate dielectric layer including a ferroelectric portion and a non-ferroelectric portion, and a channel layer disposed to adjacent to the gate dielectric layer. The ferroelectric portion is in contact with the gate electrode structure, and the non-ferroelectric portion is in contact with the interlayer insulation layer.

A semiconductor memory device according to another embodiment of the present disclosure may include a substrate, an electrode stack disposed on the substrate, the electrode stack including an interlayer insulation layer and a first electrode that are alternately stacked in a direction perpendicular to the substrate, a trench penetrating the electrode stack to expose sidewall surfaces of the interlayer insulation layer and the first electrode, a tunnel insulation layer disposed along a sidewall surface of the trench, the tunnel insulation layer including a ferroelectric portion and a non-ferroelectric portion, a selection device layer disposed on the tunnel insulation layer, and a second electrode disposed on the selection device layer. The ferroelectric portion is in contact with the first electrode, and the non-ferroelectric portion is in contact with the interlayer insulation layer.

In a method of manufacturing a semiconductor device according to another embodiment of the present disclosure, a stack structure including an interlayer insulation layer and an interlayer sacrificial layer alternately stacked is formed on a substrate. A first trench through the stack structure is formed. An amorphous ferroelectric material layer is formed on a sidewall surface of the trench. The interlayer sacrificial layer is selectively removed to form a recess selectively exposing the amorphous ferroelectric material layer. A crystallization seed layer in contact with the amorphous ferroelectric material layer and the interlayer insulation layer is formed in the recess. Crystallization heat treatment is performed to the amorphous ferroelectric material layer in contact with the crystallization seed layer.

BRIEF DESCRIPTION OF THE DRAWINGS

FIG. 19 is a flow chart schematically illustrating a method of manufacturing a semiconductor device according to another embodiment of the present disclosure.

DETAILED DESCRIPTION

Figure 1:
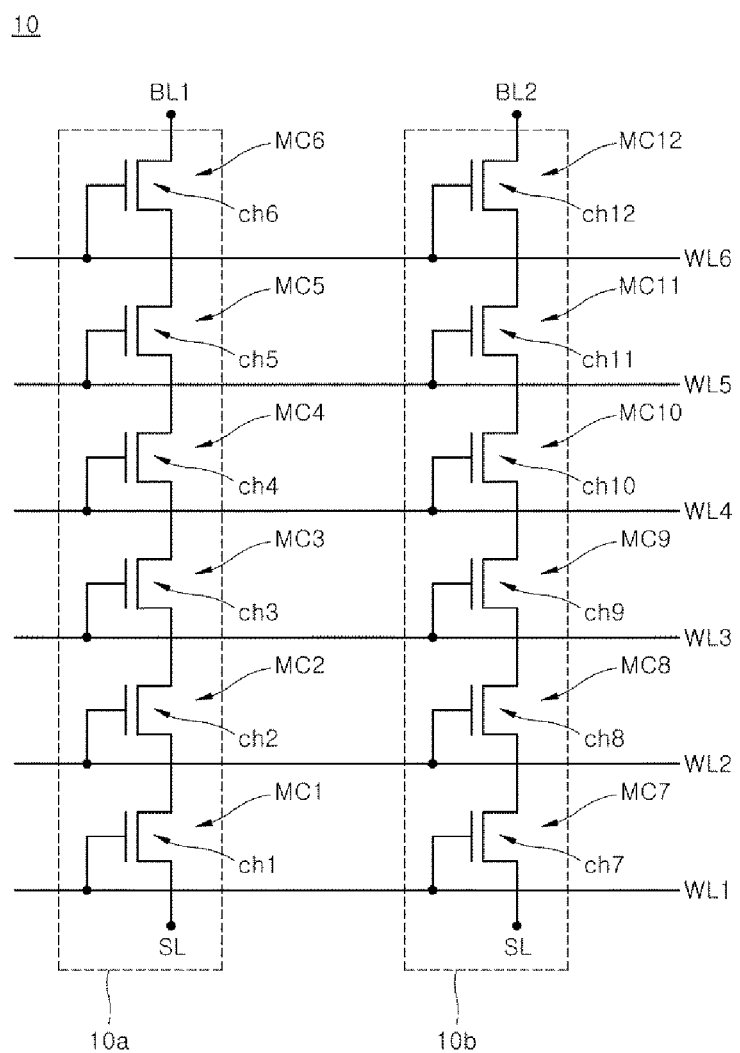
FIG. 1 is a circuit diagram schematically illustrating a semiconductor device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise", "include" or "have" are intended to specify the presence of a feature, a number, a step, an operation, an element, a part, or combinations thereof, but not used to preclude the presence or possibility of addition one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as stated order, may be performed substantially at the same time, or may be performed in a reverse order.

FIG. 1 is a circuit diagram schematically illustrating a semiconductor device according to an embodiment of the present disclosure. In the embodiment, the semiconductor device 10 may include a memory cell in the form of a transistor having a ferroelectric material layer as a gate dielectric layer.

Referring to FIG. 1, the semiconductor device 10 may include a cell array having a plurality of strings 10a and 10b. The plurality of strings 10a and 10b may, for example, be cell arrays of NAND type nonvolatile memory devices. One end of each of the strings 10a and 10b may be connected to a common source line SL and the other end of each of the strings 10a and 10b may be connected to bit lines BL1 and BL2, respectively. Although the configuration of the semiconductor device 10 is limited to the first string 10a and the second string 10b for the sake of convenience in FIG. 1, the present disclosure is not limited thereto. The number of the strings constituting the cell array is not limited and may number more than two.

The first string 10a may include first to sixth memory cell transistors MC1, MC2, MC3, MC4, MC5 and MC6, connected in series with each other. The second string 10b may include seventh to twelfth memory cell transistors MC7, MC8, MC9, MC10, MC11 and MC12, connected in series with each other. Although it is illustrated that the first and second strings 10a and 10b are each provided with six memory cell transistors for the sake of convenience in FIG. 1, the present disclosure is not limited thereto. The number of the memory cell transistors included in each of the first and second strings 10a and 10b is not limited, and may number one or more.

The first to sixth memory cell transistors MC1, MC2, MC3, MC4, MC5 and MC6 in the first string 10a may be connected to first to sixth word lines WL1, WL2, WL3, WL4, WL5 and WL6, respectively. Similarly, the seventh to twelfth memory cell transistors MC7, MC8, MC9, MC10, MC11 and MC12 in the second string 10b may be connected to the first to sixth word lines WL1, WL2, WL3, WL4, WL5 and WL6, respectively.

In an embodiment, the first to sixth memory cell transistors MC1, MC2, MC3, MC4, MC5 and MC6 may each include a ferroelectric material layer as a gate dielectric layer. The electrical dipole in the ferroelectric material layer of each of the first to sixth memory cell transistors MC1, MC2, MC3, MC4, MC5 and MC6 may be polarized in a predetermined direction when a gate voltage of a threshold voltage or higher is applied to the gate electrode layer through the first to sixth word lines WL1, WL2, WL3, WL4, WL5 and WL6, respectively. After the gate voltage is removed, the ferroelectric material layer can maintain the polarization state of the dipole. The channel resistances $ch1$, $ch2$, . . . , and $ch12$ of the first to twelfth memory cell transistors MC1, MC2, . . . , and MC12 may be changed or altered depending on the polarization states of the ferroelectric material layers. Here, the channel resistances $ch1$, $ch2$, . . . , and $ch12$ may each represent electrical resistance in respective first to twelfth memory cell transistors MC1, MC2, . . . , and MC12, and the magnitude of the channel resistances are represented or embodied by charge carriers conducting along the channel layer between a source and a drain of each memory cell transistor. The polarization state of the electrical dipole of each of the ferroelectric material layers in the first to twelfth memory cell transistors MC1, MC2, . . . , MC12 can be retained in a nonvolatile manner, and the channel resistances $ch1$, $ch2$, . . . , $ch12$ of the first to twelfth memory cell transistors MC1, MC2, . . . , MC12 can be determined or modified by corresponding the polarization states.

In an embodiment, in a method of driving the semiconductor device, the gate voltages applied from the first to the sixth word lines WL1, WL2, WL3, WL4, WL5 and WL6 can be independently controlled. Accordingly, the channel resistances $ch1$, $ch2$, . . . , $ch6$, of the memory cell transistors MC1, MC2, MC3, MC4, MC5 and MC6 constituting the first string 10a, can be independently determined, controlled or modified.

Meanwhile, the total channel resistance of the first string 10a can be determined by the sum of the channel resistances $ch1$, $ch2$, . . . , $ch6$ of the memory cell transistors MC1, MC2, MC3, MC4, MC5 and MC6, which are connected in series with each other. As a result, it is possible to store a plurality of different electrical signals in the first string 10a by separately controlling the gate voltages applied to the gate electrode layers of the memory cell transistors MC1, MC2, MC3, MC4, MC5 and MC6.

Likewise, it is possible to store a plurality of different electrical signals in the second string 10b by separately controlling the gate voltages applied from the first to the sixth word lines WL1, WL2, WL3, WL4, WL5 and WL6 to the gate electrode layers of the memory cell transistors MC7, MC8, MC9, MC10, MC11 and MC12.

According to an embodiment, the semiconductor device may be implemented in a three-dimensional structure in which a plurality of memory cell transistors are vertically stacked between a source line and a bit line, as described below.

Figure 2A:
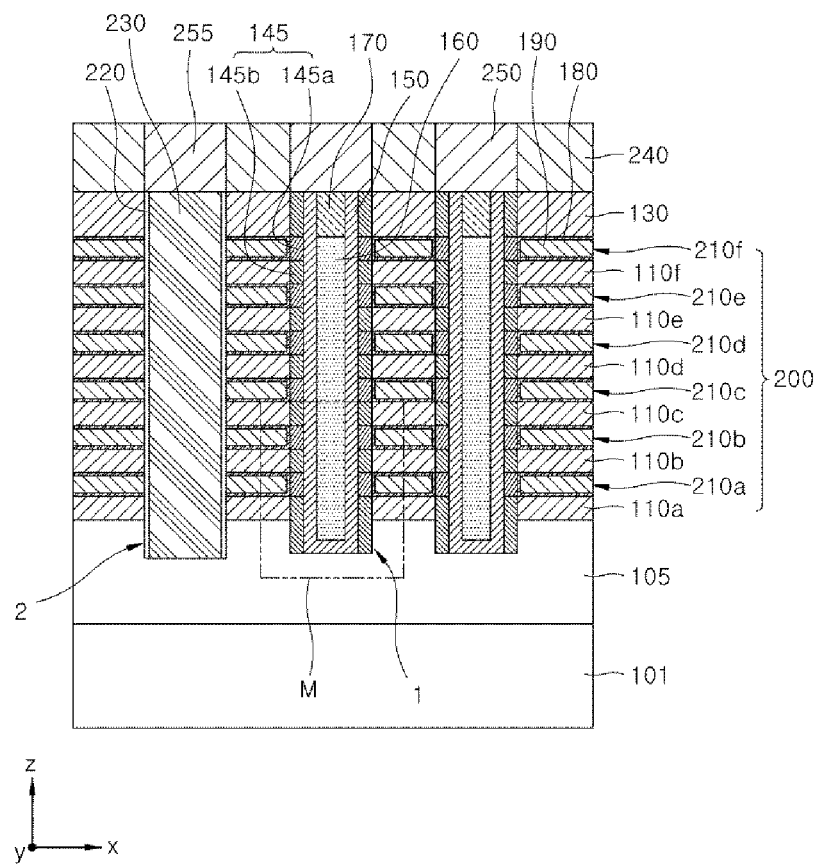
FIG. 2A is a view schematically illustrating a semiconductor device according to an embodiment of the present disclosure.
Figure 2B:
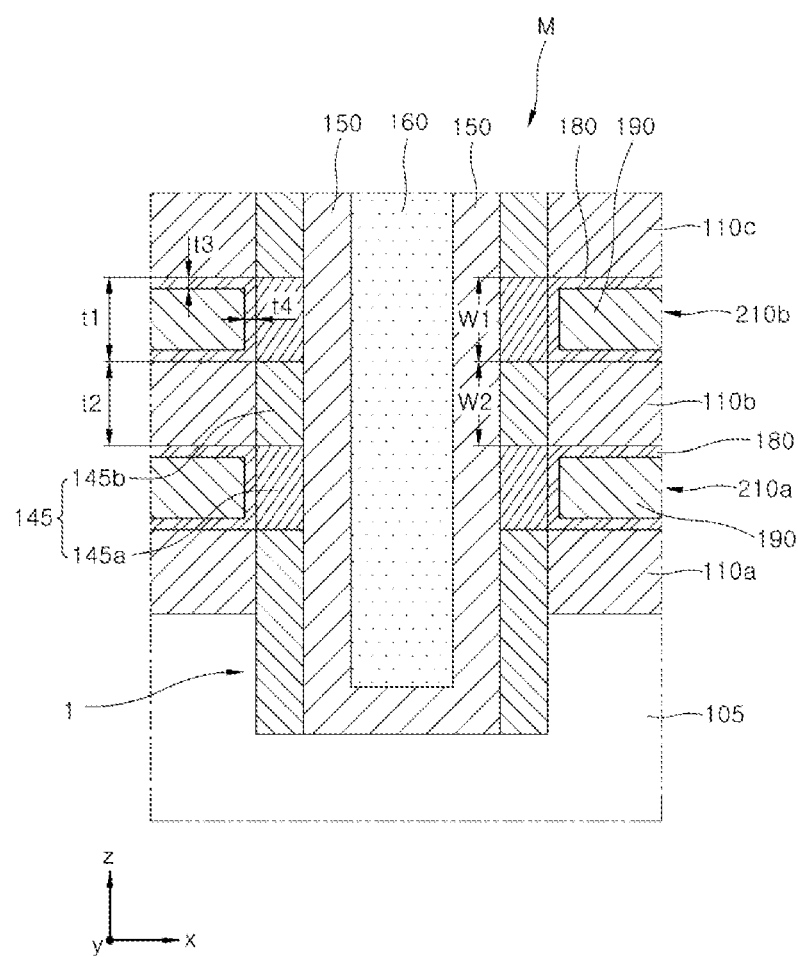
FIG. 2B is an enlarged view of region M of the semiconductor device shown in FIG. 2A.

FIG. 2A is a view schematically illustrating a semiconductor device according to an embodiment of the present disclosure and FIG. 2B is an enlarged view of region M of the semiconductor device shown in FIG. 2A. A semiconductor device 20 according to an embodiment may include a memory cell in the form of a transistor having a ferroelectric material layer as a gate dielectric layer. In FIGS. 2A and 2B, each memory cell of the semiconductor device 20 may include a ferroelectric portion 145a of a gate dielectric layer 145 located adjacent to a gate electrode structure, such as gate electrode structures 210a, 210b, 210c, 210d, 210e or 210f.

Referring to FIGS. 2A and 2B, the semiconductor device 20 may have a substrate 101, a base conductive layer 105 disposed on the substrate 101, and an electrode stack 200 disposed on the base conductive layer 105. The semiconductor device 20 may further include a trench 1 that penetrates the electrode stack 200 and extends into the base conductive layer 105. A gate dielectric layer 145 and a channel layer 150 may be disposed on a sidewall of the trench 1.

In an embodiment, the substrate 101 may be a semiconductor substrate. The semiconductor substrate may, for example, be a silicon (Si) substrate, a gallium arsenide (GaAs) substrate, an indium phosphide (InP) substrate, a germanium (Ge) substrate, or a silicon germanium (SiGe) substrate. The semiconductor substrate may be doped into n-type conductivity or p-type conductivity. In another embodiment, the substrate 101 may be an insulative substrate such as a silicon-on-insulator substrate. In yet another embodiment, the substrate 101 may be a conductive substrate such as a metal substrate.

The base conductive layer 105 may be disposed on the substrate 101. The base conductive layer 105 may include a doped semiconductor material, metal, conductive metal nitride or conductive metal silicide, for example. In an example, the base conductive layer 105 may include n-type doped silicon. In another example, the base conductive layer 105 may include tungsten (W), titanium (Ti), copper (Cu), aluminum (Al), tungsten nitride, titanium nitride, tantalum nitride, tungsten silicide, titanium silicide, tantalum silicide, or a combination of two or more thereof.

Although not illustrated, the substrate 101 may include a well formed by doping a portion of the substrate 101 with an n-type or p-type dopant. Various types of semiconductor integrated circuits may be disposed between the substrate 101 and the base conductive layer 105. As an example, one or more conductive circuit pattern layers, and one or more insulating pattern layers for insulating the conductive circuit pattern layers, may be disposed between the substrate 101 and the base conductive layer 105.

The electrode stack 200 may be disposed on the base conductive layer 105. The electrode stack 200 may include interlayer insulation layers 110a, 110b, 110c, 110d, 110e and 110f, and gate electrode structures 210a, 210b, 210c, 210d, 210e and 210f. The interlayer insulation layers 110a, 110b, 110c, 110d, 110e and 110f, and gate electrode structures 210a, 210b, 210c, 210d, 210e and 210f may be alternately stacked or interleaved on base conductive layer 105. The gate electrode structures 210a, 210b, 210c, 210d, 210e and 210f may be electrically connected to a word line (not illustrated) of the semiconductor device 20.

The interlayer insulation layers 110a, 110b, 110c, 110d, 110e and 110f may include silicon oxide, silicon nitride, or silicon oxynitride, for example. The gate electrode structures 210a, 210b, 210c, 210d, 210e and 210f may be disposed or layered to fill spaces between the interlayer insulation layers 110a, 110b, 110c, 110d, 110e and 110f in the vertical direction as illustrated in FIG. 2A.

As shown in FIGS. 2A and 2B, in an embodiment, each of the gate electrode structures 210a, 210b, 210c, 210d, 210e and 210f may include a crystallization seed layer 180 and a gate electrode layer 190. The crystallization seed layer 180 may be disposed adjacent to the interlayer insulation layers 110a, 110b, 110c, 110d, 110e and 110f and located adjacent or juxtaposed to a ferroelectric portion 145a of the gate dielectric layer 145. The gate electrode layer 190 may be disposed on or enveloped by the crystallization seed layer 180 of each of the gate electrode structures 210a, 210b, 210c, 210d, 210e and 210f. The gate electrode layers 190 may fill space within the crystallization seed layers disposed in the gate electrode structures 210a, 210b, 210c, 210d, 210e and 210f.

As illustrated in FIGS. 2A and 2B, each of the gate electrode structures 210a, 210b, 210c, 210d, 210e and 210f may have a thickness t1 of 5 to 20 nanometers (nm), for example. Each of the interlayer insulation layers 110a, 110b, 110c, 110d, 110e and 110f may have a thickness t2 of 2 nanometers (nm) to 20 nanometers (nm), for example. In an embodiment, the gate dielectric layer 145 may have a ferroelectric portion 145a and a non-ferroelectric portion 145b. The crystallization seed layer 180 may be disposed or arranged to contact the ferroelectric portion 145a of the gate dielectric layer 145 in the lateral or horizontal direction. The crystallization seed layer 180 can induce an amorphous portion of the ferroelectric material in the ferroelectric portion 145a, which is in contact with the crystallization seed layer 180, to be converted into a crystalline ferroelectric layer in a heat treatment process for the semiconductor device 20 described below. The crystallization seed layer 180 may include a crystalline conductive material. The crystallization seed layer 180 may include, for example, titanium nitride (TiN), tantalum nitride (TaN), iridium oxide (IrO2), polysilicon, or a combination of two or more thereof. In an embodiment, the crystallization seed layer 180 may have a predetermined crystallographic preferred orientation surface. As an example, the crystallization seed layer 180 may have a preferred orientation surface (using Miller indices, for example) of (100), (110) or (111). As illustrated in FIG. 2B, the crystallization seed layer 180 may have a thickness t3 of 2 nanometers (nm) to 5 nanometers (nm) in the vertical direction (i.e., the z-direction), and a thickness t4 of 2 nanometers (nm) to 5 nanometers (nm) in the lateral or horizontal direction (i.e., x-direction).

The gate electrode layer 190 may have lower electrical resistance than the crystallization seed layer 180. The gate electrode layer 190 may include, for example, tungsten (W), molybdenum (Mo), cobalt (Co), ruthenium (Ru), or a combination of two or more thereof.

Referring FIGS. 2A and 2B, the semiconductor device 20 may include the first trench 1 that penetrates the electrode stack 200 and reaches the base conductive layer 105. In addition, the semiconductor device 20 may include the gate dielectric layer 145 and a channel layer 150 that are sequentially disposed along a sidewall surface of the first trench 1.

The gate dielectric layer 145 may include a ferroelectric portion 145a and a non-ferroelectric portion 145b. In an embodiment, the ferroelectric portion 145a and the non-ferroelectric portion 145b may be different portions or segments of the gate dielectric layer 145, and one or more portions of the ferroelectric portion 145a and the non-ferroelectric portion 145b may alternate along the sidewall surface of the first trench 1 in the vertical direction.

The ferroelectric portions 145a may be disposed, arranged or configured to be in contact with the gate electrode structures 210a, 210b, 210c, 210d, 210e and 210f in the horizontal direction, and the non-ferroelectric portions 145b may be disposed to be in contact with the interlayer insulation layers 110a, 110b, 110c, 110d, 110e and 110f in the horizontal direction. As illustrated, the ferroelectric portions 145a and the non-ferroelectric portions 145b may be alternately arranged vertically along the direction perpendicular to the substrate 101 (i.e., the z-direction). Accordingly, the ferroelectric portions 145a may be disposed or located discontinuously along the z-direction.

The ferroelectric portion 145a is a region of the gate dielectric layer 145 having predetermined remanent polarization, with a polarization state that can be determined according to a write voltage applied through the gate electrode structures 210a, 210b, 210c, 210d, 210e or 210f. The remanent polarization of a ferroelectric portion 145a can be stored in a non-volatile manner. As described above, the ferroelectric portion 145a may be formed to have ferroelectric characteristics by crystallizing the amorphous ferroelectric material in the gate dielectric layer 145 adjacent to the crystallization seed layer 180 in the manufacturing process of the semiconductor device 20. In the same manner, the non-ferroelectric portion 145b may be formed by crystallizing the amorphous ferroelectric material adjacent to the interlayer insulation layers 110a, 110b, 110c, 110d, 110e and 110f. Accordingly, the ferroelectric portion 145a may have a width W1 of 5 to 20 nanometers (nm) in the vertical direction (i.e., the z-direction), corresponding to the thickness t1 of the gate electrode structures 210a, 210b, 210c, 210d, 210e and 210f, and the non-ferroelectric portion 145b may have a width W2 of 2 to 20 nanometers (nm) in the vertical direction (i.e., the z-direction), corresponding to the thickness t2 of the interlayer insulation layers 110a, 110b, 110c, 110d, 110e and 110f.

The gate dielectric layer 145 may include, for example, hafnium oxide, zirconium oxide, hafnium zirconium oxide, or a combination thereof. The gate dielectric layer 145 may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof. The gate dielectric layer 145 may have a crystalline structure.

The gate dielectric layer 145 may have a crystalline phase. However, the ferroelectric portion 145a and the non-ferroelectric portion 145b may have different crystal structures. As an example, the ferroelectric portion 145a may have a crystal structure of an orthorhombic system and the non-ferroelectric portion 145b may have a crystal structure of a tetragonal system or a monoclinic system. The ferroelectric portion 145a and the non-ferroelectric portion 145b may each have a thickness of 5 to 15 nanometers (nm) in the lateral direction (i.e., x-direction). In an embodiment, the ferroelectric portion 145a may have a crystallographic preferred orientation surface. As an example, the ferroelectric portion 145a may have preferred orientation surfaces of (100), (110), or (111). The preferred orientation surface of the ferroelectric portion 145a may be substantially the same as the preferred orientation surface of the crystallization seed layer 180. Meanwhile, the non-ferroelectric portion 145b may or may not have a crystallographic preferred orientation surface. When the non-ferroelectric portion 145b has a crystallographic preferred orientation surface, the preferred orientation surface of the non-ferroelectric portion 145b may be different from the preferred orientation surface of the ferroelectric portion 145a.

Referring to FIGS. 2A and 2B, the channel layer 150 may be disposed on or adjacent to the gate dielectric layer 145 along the sidewall surface of the first trench 1. In an embodiment, the channel layer 150 may be disposed on the gate dielectric layer 145.

The channel layer 150 may include, for example, a semiconductor material. The channel layer 150 may be an n-type doped silicon layer or an intrinsic silicon layer, for example. The channel layer 150 may be electrically connected to the base conductive layer 105 below the electrode stack 200 and may be electrically connected to a channel contact layer 170 over the electrode stack 200. A bit line connection pattern 250 may be disposed over the channel contact layer 170. The bit line connection pattern 250 may electrically connect the channel contact layer 170 to a bit line (not shown). In other words, the channel layer 150 may provide a conduction path of charges between the base conductive layer 105 and the bit line.

Referring to FIGS. 2A and 2B, a filling material layer 160 may be disposed between the channel layers 150 to fill the interior of the first trench 1. As an example, the filling material layer 160 may include an oxide, nitride, or an oxynitride.

The semiconductor device 20 may include a second trench 2 that penetrates the electrode stack 200 and reaches the base conductive layer 105. The semiconductor device 20 may include a spacer insulation layer 220 disposed on an inner wall surface of the second trench 2, and a first source line connection pattern 230 between spacer insulation layers 220 to fill the second trench 2. The first source line connection pattern 230 may be electrically connected to the base conductive layer 105 below the second trench 2. The first source line connection pattern 230 may be electrically connected to the channel layer 150 via the base conductive layer 105. In addition, the first source line connection pattern 230 may be electrically connected to a second source line connection pattern 255 disposed on or above the first source line connection pattern 230. The second source line connection pattern 255 may electrically connect the first source line connection pattern 230 to a source line (not shown).

The second source line connection pattern 255 and the bit line connection pattern 250 may be electrically insulated from each other in the lateral direction on the electrode stack 200 by a second upper insulation layer 240.

In some embodiments, when the substrate 101 is a conductor or doped with a high concentration of dopant to have conductivity, the base conductive layer 105 can be omitted. In this case, the first and second trenches 1 and 2 may be formed to expose or extend into the substrate 101. The first source line connection pattern 230 may be electrically connected to the channel layer 150 via the substrate 101.

According to another embodiment, in the gate electrode structures 210a, 210b, 210c, 210d, 201e and 210f, the crystallization seed layer 180 may function as a gate electrode layer. In this case, the gate electrode structures 210a, 210b, 210c, 210d, 201e and 210f may each be formed of a single crystallization seed layer 180 without a gate electrode layer 190. The crystallization seed layer 180 may be disposed to fill spaces between the interlayer insulation layers 110a, 110b, 110c, 110d, 110e and 110f.

According to some other embodiments, an interfacial insulation layer may be additionally disposed between the gate dielectric layer 145 and the channel layer 150. The interfacial insulation layer may serve to reduce the concentration of defect sites generated at an interface between the gate dielectric layer 145 and the channel layer 150 when the gate dielectric layer 145 and the channel layer 150 are in direct contact with each other. The interfacial insulation layer may include, for example, silicon oxide or aluminum oxide. The interfacial insulation layer may have an amorphous phase.

According to embodiments of the present disclosure described above, an electrode stack that is disposed on a substrate and includes interlayered insulation layers and gate electrode structures, alternately stacked, may be provided. Here, a portion of a gate dielectric layer in contact with the gate electrode structure may be used as a ferroelectric portion, and a portion of the gate dielectric layer in contact with the interlayer insulation layer may remain a substantially non-ferroelectric portion. Only the ferroelectric portion functions as a memory element for storing remanent polarization, while the non-ferroelectric portion separates the ferroelectric portions from each other, thereby effectively suppressing the polarization interference among the neighboring memory cells. As a result, the operation reliability of the memory cells stacked in a three-dimensional structure can be improved.

Figure 3:
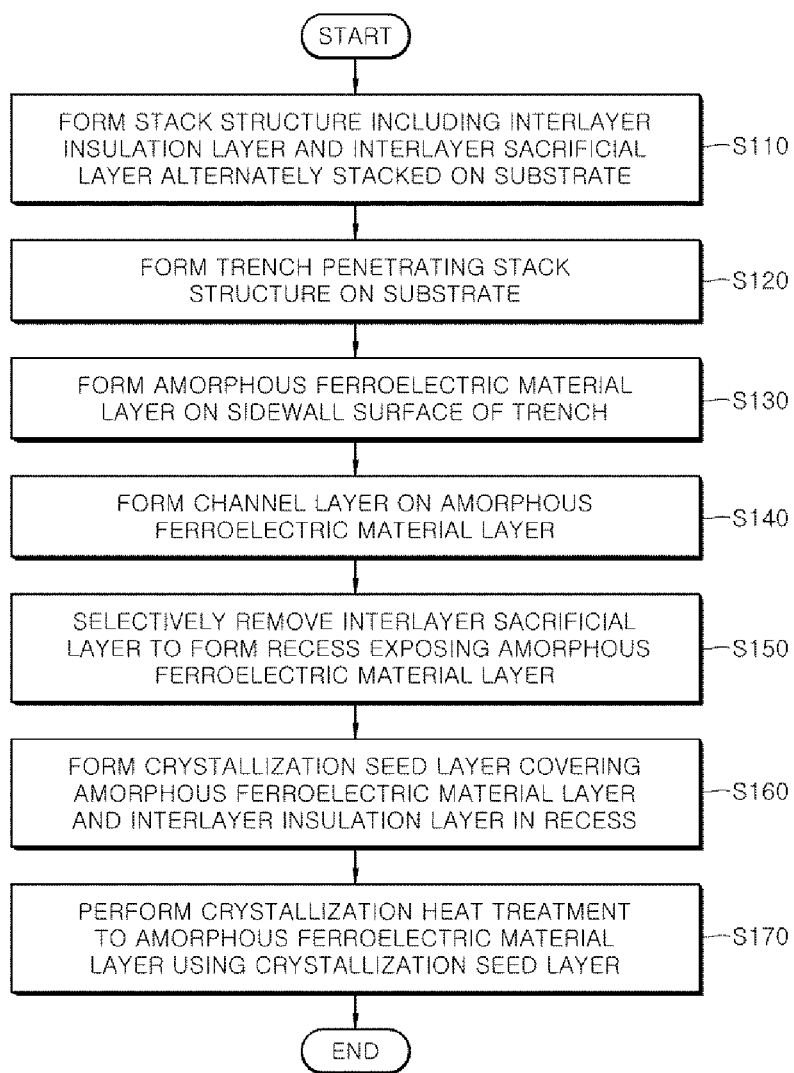
FIG. 3 is a flow chart schematically illustrating a method of manufacturing a semiconductor device according to an embodiment of the present disclosure.

FIG. 3 is a flow chart schematically illustrating a method of manufacturing a semiconductor device according to an embodiment of the present disclosure.

Referring to FIG. 3, in operation S110, a stack structure is formed on a substrate. Here, the stack structure includes interlayer insulation layers and interlayer sacrificial layers that are alternately stacked. The interlayer insulation layers and interlayer sacrificial layers may have etching selectivity with respect to each other.

In operation S120, a trench is formed to penetrate the stack structure on the substrate. The side surfaces of the interlayer insulation layers and interlayer sacrificial layers may be exposed to the sidewall surface of the trench.

In operation S130, an amorphous ferroelectric material layer is formed on the sidewall surface of the trench. When the ferroelectric material layer is in an amorphous state, the ferroelectric material layer might not exhibit sufficient ferroelectricity. When the amorphous ferroelectric material layer is converted into a crystalline ferroelectric layer having a predetermined or desired crystal structure, however, it can have sufficient ferroelectricity to improve the operation of a semiconductor device.

The amorphous ferroelectric material layer may include, for example, hafnium oxide, zirconium oxide, hafnium zirconium oxide, or a combination of two or more thereof. When the amorphous material layer is crystallized into a ferroelectric layer having a crystal structure of an orthorhombic system, the crystallized ferroelectric layer can have sufficient ferroelectricity required for the operation of a semiconductor device contemplated by embodiments of the present disclosure. In an embodiment, the amorphous ferroelectric material layer may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof.

In operation S140, a channel layer is formed on the amorphous ferroelectric material layer. The channel layer may include, for example, a semiconductor material. The channel layer may include, for example, n-type doped silicon or intrinsic silicon.

In operation S150, the interlayer sacrificial layers are selectively removed to form recesses exposing the amorphous ferroelectric material layer. In an embodiment, the process of forming the recesses may include forming a second trench penetrating the stack structure on the substrate, and include using an etchant to selectively removing the interlayer sacrificial layers, including those common to the second trench.

In operation S160, a crystallization seed layer is formed, in the recesses resulting from the selective etching of the interlayer sacrificial layers, common to the amorphous ferroelectric material layer and the interlayer insulation layers. The crystallization seed layer may include, for example, titanium nitride (TiN), tantalum nitride (TaN), iridium oxide (IrO2), polysilicon, or a combination of two or more thereof.

In operation S170, a crystallization heat treatment for the amorphous ferroelectric material layer is performed using the crystallization seed layer. In an embodiment, the crystallization heat treatment includes crystallizing a portion of the amorphous ferroelectric material layer in contact with the crystallization seed layer to result in predetermined crystal structure having ferroelectricity, and includes crystallizing a different portion of the amorphous ferroelectric material layer in contact with the interlayer insulation layers to have a predetermined crystal structure having non-ferroelectric characteristics. That is, during the crystallization heat treatment process, the crystallization seed layer can differentiate portions of the amorphous ferroelectric material layer such that the crystallized ferroelectric material layer has different predetermined ferroelectric crystal structures. As an example, after the amorphous ferroelectric material layer is crystallized, the portion having ferroelectricity may have a crystal structure of an orthorhombic system, and the portion having non-ferroelectricity may have a crystal structure of a monoclinic system.

Although not illustrated in FIG. 3, after performing operation S170, a gate electrode layer may be further formed on the crystallization seed layer and in the recesses resulting from the selective etching of the interlayer sacrificial layers. The gate electrode layer may form the gate electrode structure with the crystallization seed layer as illustrated in FIGS. 2A and 2B. Alternatively, before performing operation S170, the gate electrode layer may be formed on the crystallization seed layer. Then, the crystallization heat treatment in operation S170 may proceed. The gate electrode layer may include, for example, tungsten (W), molybdenum (Mo), cobalt (Co), ruthenium (Ru), or a combination of two or more thereof.

The semiconductor device according to an embodiment of the present disclosure can be manufactured through the above-described process. Hereinafter, a method of manufacturing the semiconductor device according to an embodiment will be described with reference to drawings showing respective operations of the manufacturing process.

FIGS. 4 to 14 are cross-sectional views illustrating a method of manufacturing a semiconductor device according to an embodiment of the present disclosure. In an embodiment, the method illustrated in FIGS. 4 to 14 may be adjusted to a method of manufacturing the semiconductor device 20.

Figure 4:
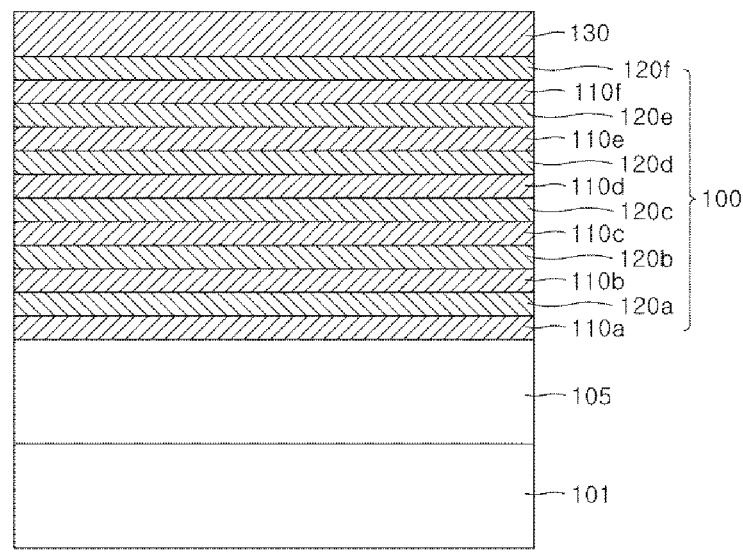
FIGS. 4 to 14 are cross-sectional views illustrating a method of manufacturing a semiconductor device according to an embodiment of the present disclosure.

Referring to FIG. 4, a substrate 101 may be prepared. In an embodiment, the substrate 101 may be a semiconductor substrate. The semiconductor substrate may be, for example, a silicon (Si) substrate, a gallium arsenide (GaAs) substrate, an indium phosphide (InP) substrate, a germanium (Ge) substrate, or a silicon germanium (SiGe) substrate. The semiconductor substrate may be doped into n-type or p-type to have conductivity. In another embodiment, the substrate 101 may be an insulative substrate such as a silicon-on-insulator substrate. In yet another embodiment, the substrate 101 may be a conductive substrate such as a metal substrate.

A base conductive layer 105 may be formed on the substrate 101. The base conductive layer 105 may include, for example, doped semiconductor, metal, conductive metal nitride or conductive metal silicide. In an embodiment, when the substrate 101 is a semiconductor substrate of a silicon material, the base conductive layer 105 may be a semiconductor material layer including n-type doped silicon. The base conductive layer 105 may be formed by, for example, a known method such as a chemical vapor deposition method, an atomic layer deposition method, or a sputtering method.

Although not illustrated, the substrate 101 may include a well region doped with an n-type or p-type dopant. Various types of semiconductor integrated circuits may be disposed between the substrate 101 and the base conductive layer 105. As an example, one or more conductive circuit pattern layers and one or more insulating pattern layers for insulating the conductive circuit pattern layers may be disposed between the substrate 101 and the base conductive layer 105.

A stack structure 100 may be formed on the base conductive layer 105. The stack structure 100 may be formed by alternately stacking interlayer insulation layers 110a, 110b, 110c, 110d, 110e and 110f and interlayer sacrificial layers 120a, 120b, 120c, 120d, 120e and 120f. The interlayer insulation layers 110a, 110b, 110c, 110d, 110e and 110f and the interlayer sacrificial layers 120a, 120b, 120c, 120d, 120e and 120f may have etching selectivity with respect to each other. As an example, the interlayer insulation layers 110a, 110b, 110c, 110d, 110e and 110f may include an oxide and the interlayer sacrificial layers 120a, 120b, 120c, 120d, 120e and 120f may include a nitride. As another example, the interlayer insulation layers 110a, 110b, 110c, 110d, 110e and 110f may include a nitride and the interlayer sacrificial layers 120a, 120b, 120c, 120d, 120e and 120f may include an oxide. As an example, the interlayer insulation layers 110a, 110b, 110c, 110d, 110e and 110f may each have a thickness of 2 to 20 nanometers (nm) and the interlayer sacrificial layers 120a, 120b, 120c, 120d, 120e and 120f may each have a thickness of 5 to 20 nanometers (nm).

In an embodiment, when the stack structure 100 is formed on the base conductive layer 105, the interlayer insulation layer 110a may be first formed on the base conductive layer 105, and the interlayer sacrificial layer 120a may be formed on the interlayer insulation layer 110a. Then, another interlayer insulation layer and another interlayer sacrificial layer may be sequentially stacked.

Although FIG. 4 illustrates six interlayer insulation layers 110a, 110b, 110c, 110d, 110e and 110f and six interlayer sacrificial layers 120a, 120b, 120c, 120d, 120e and 120f, embodiments contemplated by this disclosure are not limited thereto. The number of interlayer insulation layers and the number of interlayer sacrificial layers in a stack structure can vary, and can number one or more.

A first upper insulation layer 130 may be formed on the uppermost interlayer sacrificial layer 120f of the stack structure 100. The first upper insulation layer 130 and the interlayer sacrificial layers 120a, 120b, 120c, 120d, 120e and 120f may have etching selectivity with respect to each other. As an example, the first upper insulation layer 130 may be formed of the same material as the interlayer insulation layers 110a, 110b, 110c, 110d, 110e and 110f. In an embodiment, the first upper insulation layer 130 may be thicker than the interlayer insulation layers 110a, 110b, 110c, 110d, 110e and 110f. Unlike what is illustrated in FIG. 4, in other embodiments, the thickness of the first upper insulating layer 130 may be equal to or thinner than the thickness of each of the interlayer insulating layers 110a, 110b, 110c, 110d, 110e, and 110f. The interlayer insulating layers 110a, 110b, 110c, 110d, 110e and 110f, the interlayer sacrificial layers 120a, 120b, 120c, 120d, 120e and 120f, and the first upper insulation layer 130 may be formed by using, for example, a chemical vapor deposition method, an atomic layer deposition method, a coating method or the like.

Figure 5:
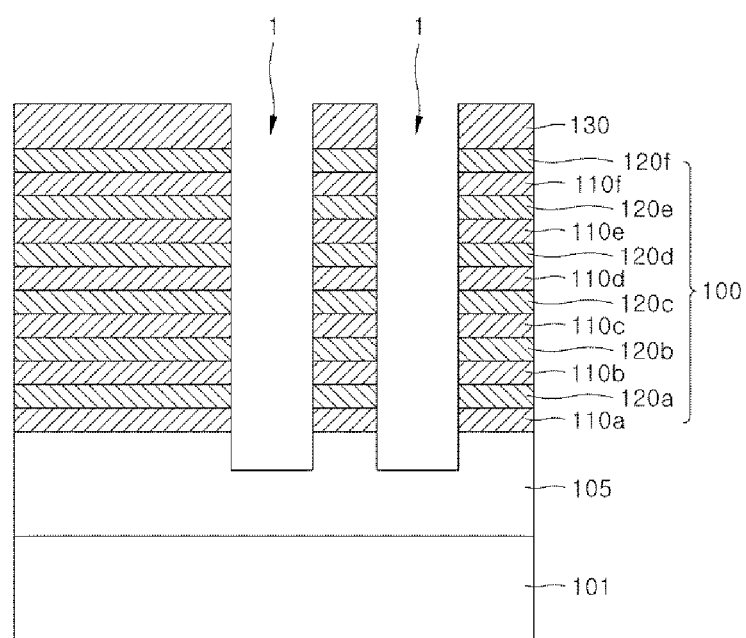

Referring to FIG. 5, a first trench 1 may be formed to penetrate through the stack structure 100 and the first upper insulation layer 130 and expose a portion of the base conductive layer 105. In an embodiment, the first trench 1 may be formed by performing anisotropic etching with respect to the stack structure 100 and the first upper insulation layer 130. As an example, a dry etching method using plasma may be used as the anisotropic etching. As illustrated, the etching process may expose, in the first trench 1, side surfaces or edges of the first upper insulation layer 130, the interlayer insulation layers 110a, 110b, 110c, 110d, 110e and 110f, and the interlayer sacrificial layers 120a, 120b, 120c, 120d, 120e and 120f.

Figure 6:
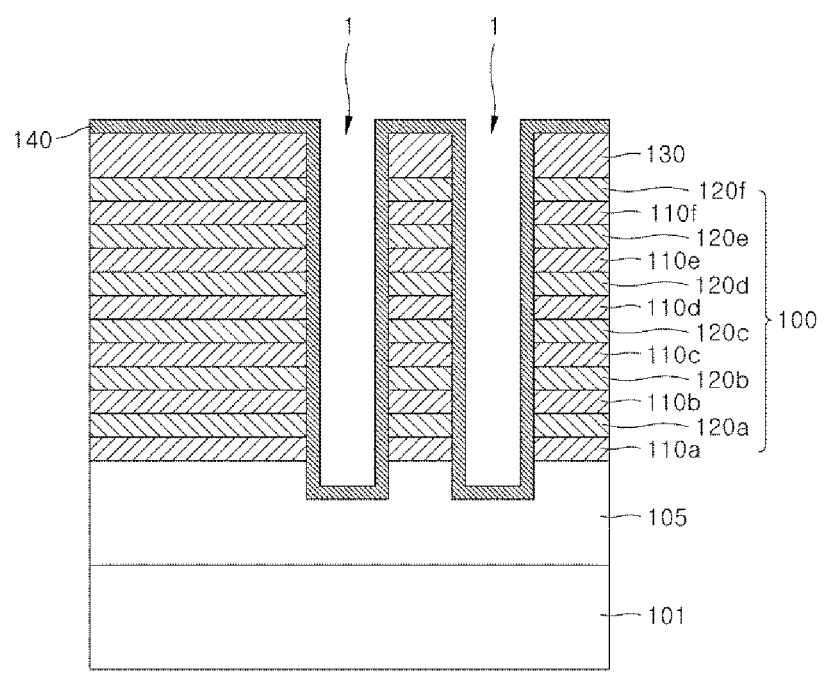

Referring to FIG. 6, a ferroelectric material layer 140 may be formed on an inner wall surface of the first trench 1 and on the first upper insulation layer 130 outside of the first trench 1. The ferroelectric material layer 140 may be formed in an amorphous phase on the inner wall surface of the first trench 1 and on the first upper insulation layer 130. The ferroelectric material layer 140 may include, for example, hafnium oxide, zirconium oxide, hafnium zirconium oxide or a combination thereof. In an embodiment, the ferroelectric material layer 140 may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof. The ferroelectric material layer 140 may be formed by using, for example, an atomic layer deposition method, a chemical vapor deposition method or the like. The ferroelectric material layer 140 may be formed in a thickness of 5 to 15 nanometers (nm), as an example.

Figure 7:
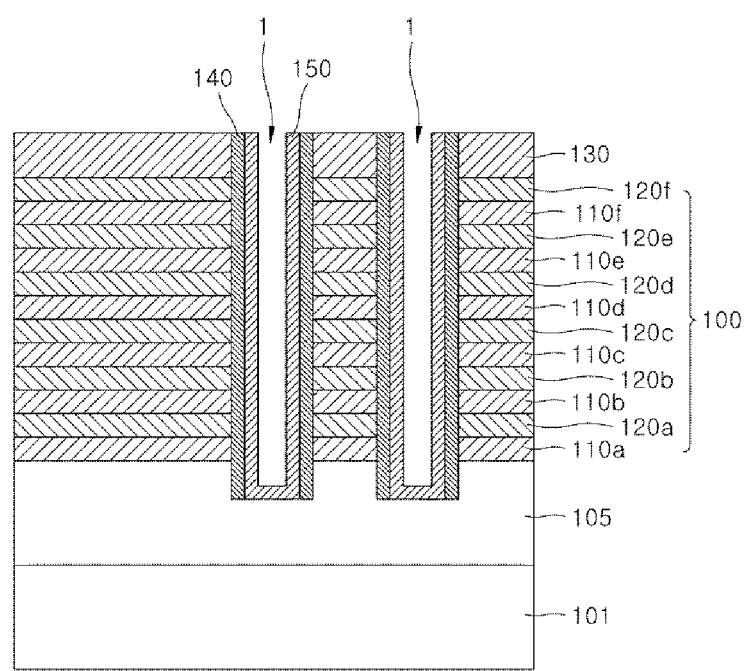

Referring to FIG. 7, the ferroelectric material layer 140 may be anisotropically etched to selectively remove the ferroelectric material layer 140 formed on a bottom surface of the first trench 1 and on an upper surface of the first upper insulation layer 130. In an embodiment, the anisotropic etching process may be performed by a dry etching method using plasma. In another embodiment, the anisotropic etching process may be performed by an etch-back method.

As a result of the anisotropic etching process, the base conductive layer 105 may be exposed at the bottom of the first trench 1, and the ferroelectric material layer 140 formed on the upper surface of the first upper insulation layer 130 may be removed. Accordingly, the remaining ferroelectric material layer 140 can be disposed on one or more sidewall surfaces of the first trench 1.

Subsequently, a channel layer 150 may be formed on the base conductive layer 105 located at the bottom of the first trench 1 and on the ferroelectric material layer 140 located on the sidewall surface of the first trench 1. The channel layer 150 may include, for example, a semiconductor material. The channel layer 150 may include, for example, n-type doped silicon or intrinsic silicon. In an embodiment, the channel layer 150 may be formed by an atomic layer deposition method or a chemical vapor deposition method. Any of the channel layer 150 formed outside the first trench 1 may be removed by a chemical mechanical polishing method, as an example. Before performing the chemical mechanical polishing, the ferroelectric material layer 140 and the channel layer 150 in first trench 1 may be filled with a separate protection layer. After performing the chemical mechanical polishing, the protection layer may be removed from the inside of the first trench 1. As a result, as illustrated in FIG. 7, the upper surfaces of the first upper insulation layer 130, and the edges of ferroelectric material layer 140 and channel layer 150, may be planarized so as to be located on the substantially same plane.

Figure 8:
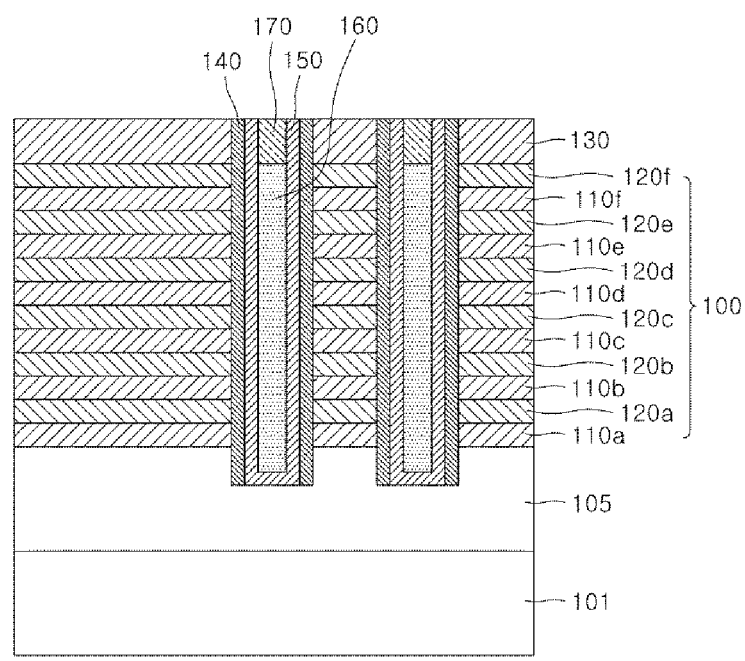

Referring to FIG. 8, the inside of the first trench 1 may be filled with a filling material layer 160. The inside of the first trench 1 may be filled by using, for example, a chemical vapor deposition method or a coating method. The filling material layer 160 may include, for example, silicon oxide, silicon nitride, silicon oxynitride or the like.

After filling the inside of the first trench 1 with the filling material layer 160, a planarization process for removing the filling material formed on the first upper insulation layer 130 may be performed. Accordingly, the upper surface of the buried filling material layer 160 and the upper surface of the first upper insulation layer 130 can be located on substantially the same plane. The planarization process may be performed by using, for example, a chemical mechanical polishing method or an etch-back method.

Subsequently, the filling material layer 160 may be etched back to form a recess in the first trench 1. Then, the recess may be filled with a conductive film to form a channel contact layer 170. The recess may be filled with a conductive film by applying, for example, a chemical vapor deposition method or a coating method. A portion of the conductive film formed on the first upper insulation layer 130 may be further removed through a planarization process. Accordingly, the upper surface of the channel contact layer 170 and the upper surface of the first upper insulation layer 130 can be located on substantially the same plane.

The channel contact layer 170 may include, for example, metal or metal nitride. The channel contact layer 170 may be formed in order to prevent an increase in contact resistance that may occur when the channel layer 150 and a bit line connection pattern 250, as described below with reference to FIG. 14, directly contact each other.

Figure 9:
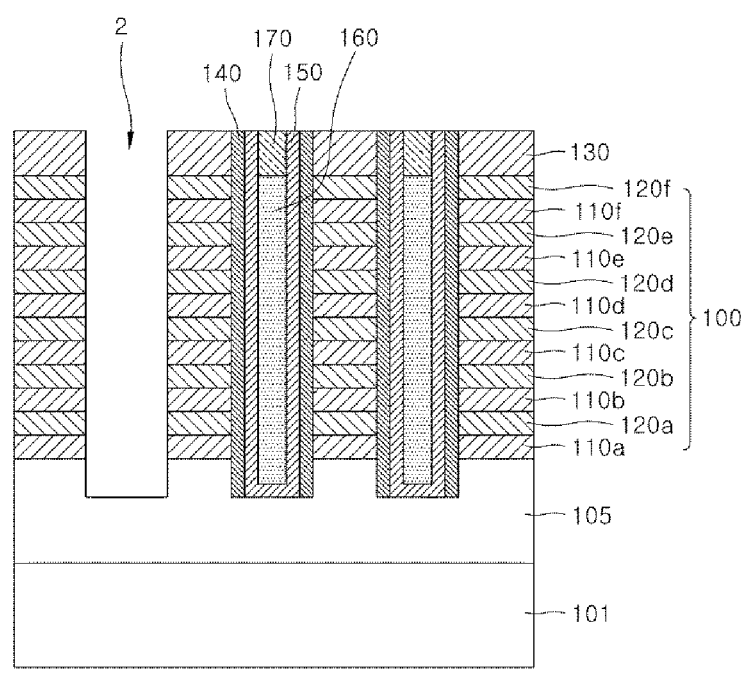

Referring to FIG. 9, a second trench 2 may be formed to penetrate through the stack structure 100 and selectively expose the base conductive layer 105. The second trench 2 may include exposed sidewall surfaces or edges of the interlayer insulation layers 110a, 110b, 110c, 110d, 110e and 110f, interlayer sacrificial layers 120a, 120b, 120c, 120d, 120e and 120f, and first upper insulation layer 130.

Figure 10:
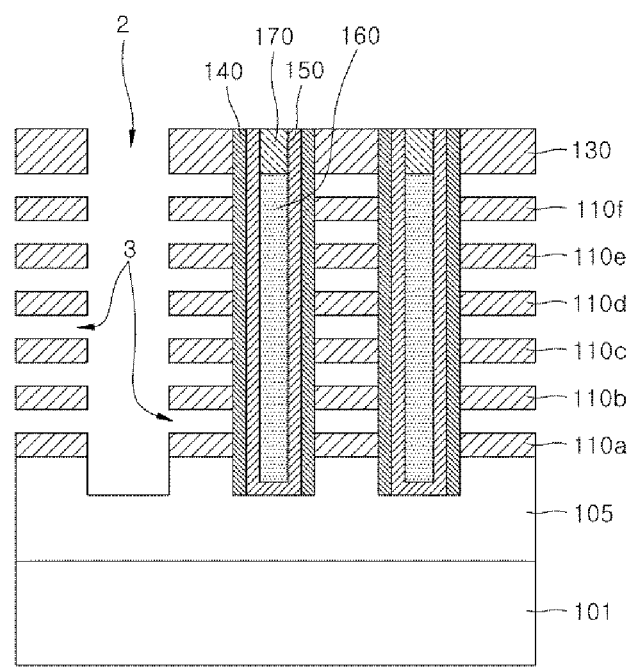

Referring to FIG. 10, the interlayer sacrificial layers 120a, 120b, 120c, 120d, 120e and 120f of the stack structure 100 may be selectively removed to leave the interlayer insulation layers 110a, 110b, 110c, 110d, 110e and 110f. In an embodiment, the interlayer sacrificial layers 120a, 120b, 120c, 120d, 120e and 120f may be wet-etched by providing an etchant having etching selectivity with respect to the interlayer insulation layers 110a, 110b, 110c, 110d, 110e and 110f and the first upper insulation layer 130. As a result, recesses 3 in second trench 2 and exposing surfaces of the ferroelectric material layer 140 may be formed.

Figure 11:
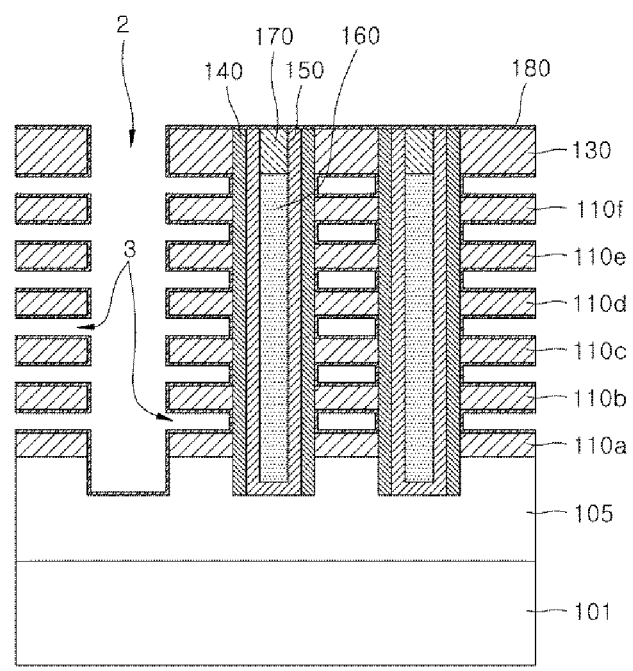

Referring to FIG. 11, a crystallization seed layer 180 may be formed on exposed portions of ferroelectric material layer 140 and the interlayer insulation layers 110a, 110b, 110c, 110d, 110e and 110f. The crystallization seed layer 180 may be formed in the form of a crystalline thin film using, for example, an atomic layer deposition method or a chemical vapor deposition method. The crystalline thin film may include, for example, titanium nitride (TiN), tantalum nitride (TaN), iridium oxide (IrO2), polysilicon or a combination thereof. The crystalline thin film may be formed, for example, in a thickness of 2 to 5 nanometers (nm). In an embodiment, the crystallization seed layer 180 may have a crystallographic preferred orientation surface. As an example, the crystallization seed layer 180 may have a preferred orientation surface of (100), (110) or (111).

Subsequently, crystallization heat treatment may be performed with respect to the ferroelectric material layer 140 using the crystallization seed layer 180. The crystallization heat treatment may be performed at a temperature of 400 to 1000° C. in an oxygen atmosphere or an inert gas atmosphere. The inert gas atmosphere may be a nitrogen atmosphere or an argon atmosphere. Through the crystallization heat treatment, as illustrated in FIG. 12, a portion of the ferroelectric material layer 140, which contacts the crystallization seed layer 180, can develop ferroelectric properties.

Figure 12:
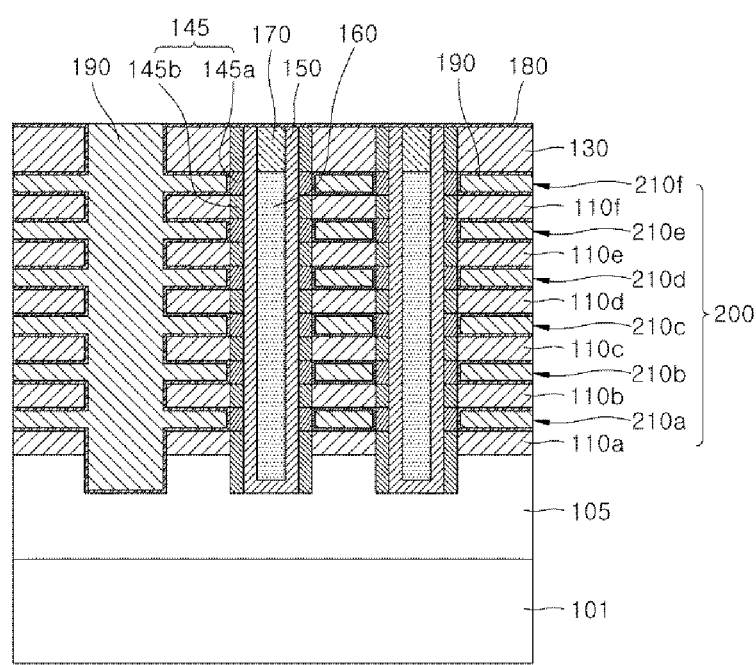

Referring to FIG. 12, after the crystallization heat treatment, the ferroelectric material layer 140 may become a gate dielectric layer 145 having ferroelectric portions 145a and non-ferroelectric portions 145b. The ferroelectric portion 145a is a portion in contact with the crystallization seed layer 180, and may have a crystal structure that supports ferroelectric characteristics. The non-ferroelectric portion 145b is a portion in contact with the interlayer insulation layers 110a, 110b, 110c, 110d, 110e and 110f, and may have a crystal structure that does not exhibit or support ferroelectric properties. As an example, when the ferroelectric material layer 140 includes at least one of hafnium oxide, zirconium oxide, and hafnium zirconium oxide, the ferroelectric portion 145a may have a crystal structure of an orthorhombic system, and the non-ferroelectric portion 145b may have a crystal structure of a tetragonal system or a monoclinic system.

In an embodiment, the ferroelectric portion 145a may have a crystallographic preferred orientation surface. As an example, the ferroelectric portion 145a may have a preferred orientation surface of (100), (110) or (111). The preferred orientation surface of the ferroelectric portion 145a may be substantially the same as the preferred orientation surface of the crystallization seed layer 180. On the other hand, the non-ferroelectric portion 145b may or may not have a crystallographic preferred orientation surface. When the non-ferroelectric portion 145b has a crystallographic preferred orientation surface, the preferred orientation surface of the non-ferroelectric portion 145b may be different from the preferred orientation surface of the ferroelectric portion 145a.

Various theories have been proposed in relation to the mechanism by which the crystallization heat treatment using the crystallization seed layer 180 forms the ferroelectric portion 145a. According to any of these various theories, when the crystallization seed layer 180 is selected such that the crystal lattice constant of the crystallization seed layer 180 is different from the crystal lattice constant of the ferroelectric portion 145a, the crystallization seed layer 180 may apply a tensile strain or a compressive strain to the ferroelectric material layer 140 during the crystallization heat treatment process. The stress caused by the strain can convert the crystal structure of the ferroelectric material layer into a ferroelectric crystal structure.

According to some of the above various theories, when the ferroelectric material layer includes dopant elements, the crystallization seed layer 180 can prevent the dopant elements from diffusing out of the ferroelectric material layer. As a result, in the crystallization heat treatment process, the dopant elements can induce the crystal structure of the ferroelectric material layer 140 to change to a predetermined crystal structure having ferroelectric characteristics.

Referring to FIG. 12, the interior of the recesses 3, and the second trench 2, in which the crystallization seed layer 180 is formed may be filled with a conductive material layer 190. The conductive material layer 190 may include, for example, tungsten (W), molybdenum (Mo), cobalt (Co), ruthenium (Ru), or a combination of two or more thereof. According to an embodiment, after filling the recesses 3 and the second trench 2 with the conductive material layer 190, the conductive material layer 190 formed on the exterior of the second trench 2 may be further removed by a planarization process. As a result, the uppermost surface of the conductive material layer 190 common to second trench 2 and the uppermost surface of the crystallization seed layer 180 can be found on substantially the same plane.

Figure 13:
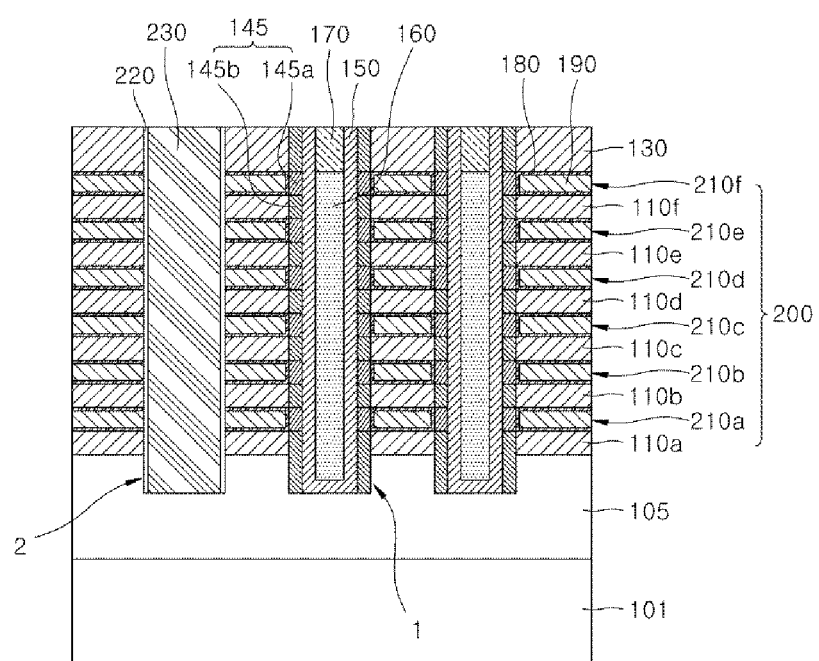

Referring to FIG. 13, the crystallization seed layer 180 and the conductive material layer 190 formed inside the second trench 2 may be selectively removed to expose the base conductive layer 105. The crystallization seed layer 180 and the conductive material layer 190 may be selectively removed by applying, for example, an anisotropic etching method. Meanwhile, remaining portions of the conductive layer 190 in the recesses 3 may form gate electrode layers 190.

Subsequently, a spacer insulation layer 220 may be formed on a sidewall of the second trench 2. The spacer insulation layer 220 may be formed by first forming an insulation film along a sidewall of the second trench 2 and anisotropically etching the insulation film to remove a portion of the insulation film on the bottom surface of the trench 2 to expose base conductive layer 105. The insulation film may be formed by using, for example, a chemical vapor deposition method or an atomic layer deposition method.

Referring to FIG. 13, the inside of the second trench 2 in which the spacer insulation layer 220 is formed may be filled with a conductive film to form a first source line connection pattern 230. The first source line connection pattern 230 may include, for example, metal, conductive metal nitride, conductive metal carbide, conductive metal silicide or a combination of two or more thereof. The first source line connection pattern 230 may include, for example, tungsten (W), titanium (Ti), copper (Cu), tungsten nitride, titanium nitride, tantalum nitride, tungsten carbide, titanium carbide, tungsten silicide, titanium silicide, tantalum silicide, or a combination of two or more thereof. Meanwhile, the spacer insulation layer 220 can electrically insulate the first source line connection pattern 230 from the gate electrode structures 210a, 210b, 210c, 210d, 210e and 210f.

Figure 14:
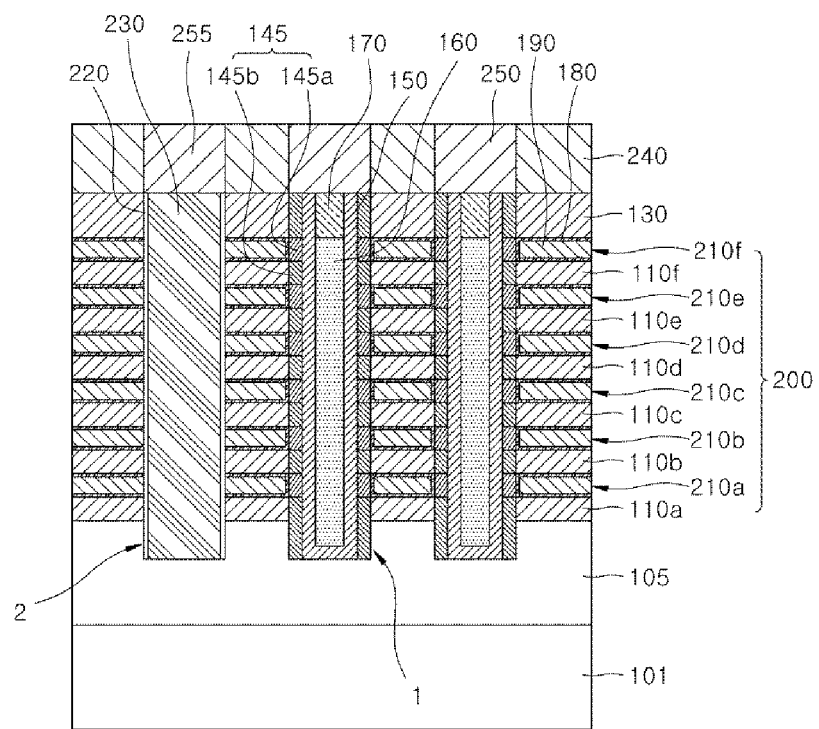

Referring to FIG. 14, a second upper insulation layer 240 may be formed on the first upper insulation layer 130. The second upper insulation layer 240 may include, for example, silicon oxide, silicon nitride, or silicon oxynitride. The second upper insulation layer 240 may be formed by utilizing, for example, a chemical vapor deposition method or a coating method.

Subsequently, a bit line connection pattern 250, electrically connected to the channel contact layer 170, may be formed in the second upper insulation layer 240. In addition, a second source line connection pattern 255 electrically connected to the first source line connection pattern 230 may be formed in the second upper insulation layer 240 and substantially above second trench 2. This process may proceed as follows. The second upper insulation layer 240 may be selectively etched to form contact patterns exposing the channel contact layer 170 and the first source line connection pattern 230, respectively. Next, the contact patterns may be filled with a conductive film. The conductive film may include, for example, tungsten (W), titanium (Ti), copper (Cu), tungsten nitride, titanium nitride, tantalum nitride, tungsten carbide, titanium carbide, tungsten silicide, titanium silicide, tantalum silicide, or a combination of two or more thereof.

The first and second source line contact patterns 230 and 255 can electrically connect the base conductive layer 105 to a source line (not shown) of the semiconductor device. The bit line connection pattern 250 can electrically connect the channel layer 150 to a bit line (not shown) of the semiconductor device.

By performing the above-described processes, semiconductor devices according to embodiments of the present disclosure can be manufactured. In other embodiments, the crystallization heat treatment using the crystallization seed layer 180, described above in connection with FIG. 11, may be performed on the amorphous ferroelectric material layer 140 after forming the gate electrode layer 190 shown in FIG. 13.

In yet other embodiments, when the substrate 101 is a conductor or is doped with a high concentration of dopant to have conductivity, the base conductive layer 105 may be omitted. In this case, the first and second trenches 1 and 2 may be formed to expose the substrate 101.

In further embodiments, in the gate electrode structures 210a, 210b, 210c, 210d, 210e and 210f, the crystallization seed layer 180 can perform the function of a gate electrode layer. In such cases, the gate electrode structures 210a, 210b, 210c, 210d, 210e and 210f may be formed of uniform crystallization seed layers 180 without the gate electrode layers 190. In an embodiment, in the process of forming the crystallization seed layer 180 related to FIG. 11, the crystallization seed layer 180 may be formed to fill spaces between the neighboring interlayer insulating layers 110a, 110b, 110c, 110d, 110e and 110f.

According to other embodiments, in the process described above and with reference to FIG. 6, an interfacial insulation layer may be additionally formed between the ferroelectric material layer 140 and the channel layer 150. The interfacial insulation layer may include, for example, silicon oxide or aluminum oxide.

As described above, embodiments of the present disclosure can provide methods of manufacturing a three-dimensional semiconductor device having ferroelectric portions 145a of the gate dielectric layer 145 serve as memory layers. When a portion of the amorphous ferroelectric material layer 140 is crystallized to produce the ferroelectric portion 145a, that portion of the amorphous ferroelectric material layer 140 in contact with the crystallization seed layer 180 may be crystallized to have ferroelectric characteristics.

By adopting the above-described methods, the ferroelectric portion 145a and the non-ferroelectric portion 145b can be formed and alternate in the direction perpendicular to the substrate. The polarization interference generated among neighboring memory cells when voltage is applied to the gate electrode layers 190 can be effectively suppressed as compared with a case in which the entirety of the gate dielectric layer 145 has ferroelectric properties. As a result, the operational reliability of the memory cell with above-described three-dimensional structure can be improved.

Furthermore, according to embodiments of the present disclosure, the interval between the memory cells which are separated from each other in the vertical direction can be effectively controlled by controlling the thickness of the interlayer insulation layers 110a, 110b, 110c, 110d, 110e and 110f. The height of each of the interlayer insulation layers can be reduced to a size of 5 to 20 nanometers (nm), thereby effectively improving the memory cell density of the semiconductor device.

Figure 15:
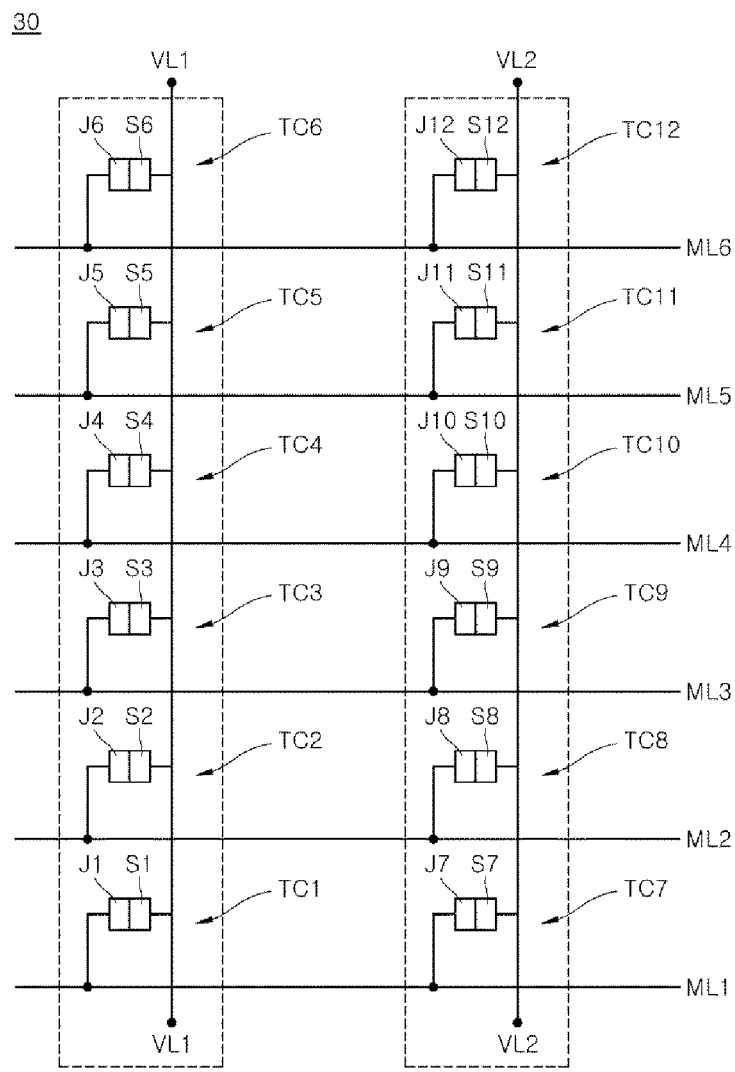
FIG. 15 is a circuit diagram schematically illustrating a semiconductor device according to another embodiment of the present disclosure.

FIG. 15 is a circuit diagram schematically illustrating a semiconductor device according to another embodiment of the present disclosure. In an embodiment, the semiconductor device 30 may include a tunnel junction memory cell having a ferroelectric material layer as a tunnel insulation layer.

Referring to FIG. 15, the semiconductor device 30 may have a plurality of first electrode lines VL1 and VL2 and a plurality of second electrode lines ML1, ML2, ML3, ML4, ML5 and ML6. In addition, the semiconductor device 30 may include memory cells TC1, TC2, TC3, TC4, ..., TC10, TC11 and TC12 arranged in regions where the first electrode lines VL1 and VL2 and the second electrode lines ML1, ML2, ML3, ML4, ML5 and ML6 intersect. Each of the memory cells TC1, TC2, TC3, TC4, ..., TC10, TC11 and TC12 is a device having two terminals connected to the first electrode lines VL1 and VL2 and the second electrode lines ML1, ML2, ML3, ML4, ML5 and ML6, and each of the memory cells TC1, TC2, TC3, TC4, ..., TC10, TC11 and TC12 may be randomly accessed.

The memory cells TC1, TC2, TC3, TC4, ..., TC10, TC11 and TC12 may include tunnel junction devices J1, J2, J3, ..., J10, J11 and J12 and selection devices S1, S2, S3, .... S10, S11 and S12. The tunnel junction devices J1, J2, J3, ..., J10, J11 and J12 and the selection devices S1, S2, S3, .... S10, S11 and S12 may be electrically connected in series. Methods of operating the tunnel junction devices J1, J2, J3, ..., J10, J11 and J12 will be described in detail with reference to FIGS. 16A, 16B, 17A and 17B.

The selection devices S1, S2, S3, .... S10, S11 and S12 are switching devices designed to be turned on only when the voltage applied across the selection devices S1, S2, S3, .... S10, S11 and S12 is equal to or greater than a predetermined threshold voltage. The selection devices S1, S2, S3, .... S10, S11 and S12 can suppress the leakage current inside the tunnel junction devices J1, J2, J3, ..., J10, J11 and J12 when the voltage applied to both ends of the selection devices S1, S2, S3, .... S10, S11 and S12 is equal to or lower than the threshold voltage. The selection devices S1, S2, S3, .... S10, S11 and S12 may each be, for example, an ovonic device, a metal-insulation-transition device, or a filament-driven volatile switching device, but various other devices are also possible and the present disclosure is not limited thereto.

FIGS. 16A, 16B, 17A and 17B are views schematically illustrating operations of tunnel junction devices according to embodiments of the present disclosure. Each of the tunnel junction devices J1, J2, J3, ..., J10, J11 and J12 may include a first electrode M1, a ferroelectric tunnel insulation layer F and a second electrode M2. The ferroelectric tunnel insulation layer F may be disposed between the first electrode M1 and the second electrode M2.

Figure 16A:
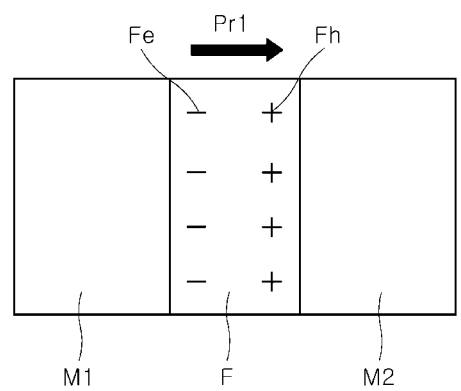
FIGS. 16A, 16B, 17A and 17B are views schematically illustrating the operation of a tunnel junction device according to an embodiment of the present disclosure.

Referring to FIG. 16A, when the first remanent polarization Pr1 is stored in the ferroelectric tunnel insulation layer F, negative charges Fe are arranged in an inner region of the ferroelectric tunnel insulation layer F adjacent to an interface between the ferroelectric tunnel insulation layer F and the first electrode M1, even if no external voltage is applied. In addition, positive charges Fh are arranged in an inner region of the ferroelectric tunnel insulation layer F adjacent to an interface between the ferroelectric tunnel insulation layer F and the second electrode M2 in the absence of an externally applied voltage. The positive charges Fh and the negative charges Fe can change the magnitude of an interface energy barrier between the ferroelectric tunnel insulation layer F and the first electrode M1 and the magnitude of an interface energy barrier between the ferroelectric tunnel insulation layer F and the second electrode M2.

Figure 16B:
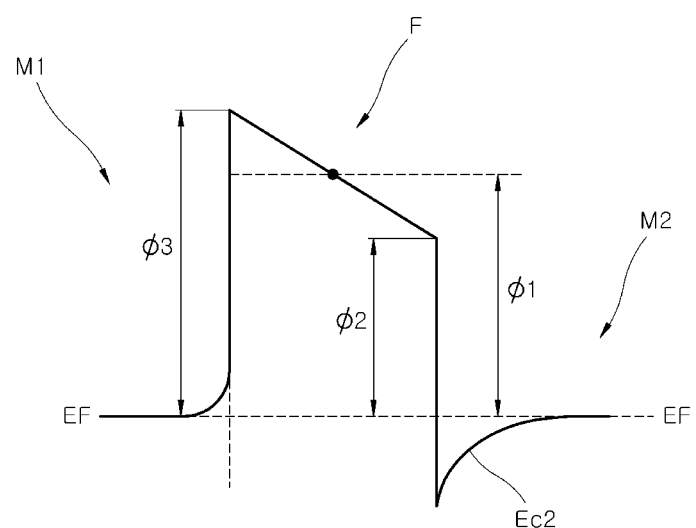

Referring to FIG. 16B, when the arrangement of the positive charges and the negative charges shown in FIG. 16A is in place, the interface barrier energy between the ferroelectric tunnel insulation layer F and the second electrode M2, based on electrons, may be reduced from the first barrier energy $\Phi 1$ to the second barrier energy $\Phi 2$. When no external voltage is applied to the tunnel junction device, the first electrode M1 and the second electrode M2 have the same fermi level energies EF. Conduction band energy Ec2 of the second electrode M2 is disposed under the fermi level energy EF of the second electrode M2 near the interface between the ferroelectric tunnel insulation layer F and the second electrode M2. That is, electron densities of the second electrode M2 near the interface may increase, compared with electron densities in the bulk area of the second electrode M2. On the other hand, the interface barrier energy between the ferroelectric tunnel insulation layer F and the first electrode M1, based on electrons, may be increased from the first barrier energy $\Phi 1$ to a third barrier energy $\Phi 3$. The first barrier energy $\Phi 1$ may be an interface barrier energy when the positive charges Fh and the negative charges Fe are not present. The width of tunneling of the electrons from the second electrode M2 through the ferroelectric tunnel insulation layer F depends on the change of the interface barrier energy, so that the probability that the electrons can tunnel from the second electrode M2 to the first electrode M1 can be increased under the influence of remanent polarization Pr1.

In FIG. 16A, positive charges Fh are arranged in the inner region of the ferroelectric tunnel insulation layer F, which is adjacent to the second electrode M2, so the density of electrons in the second electrode M2 adjacent to the ferroelectric tunnel insulation layer F may be increased and the barrier energy decreased, as illustrated in FIG. 16B. As a result, the probability that the electrons tunnel from the second electrode M2 to the ferroelectric tunnel insulation layer F, and then to the first electrode M1, can be increased.

In conclusion, when the first remanent polarization Pr1 is stored in the ferroelectric tunnel insulation layer F, the density of the electrons tunneling from the second electrode M2 to the first electrode M1 increases when a read voltage is applied to a tunnel junction device such as J1, J2, J3, ..., J10, J11 and J12.

Figure 17A:
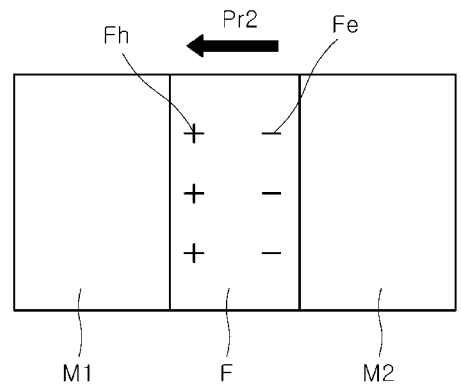

Referring to FIG. 17A, when the second remanent polarization Pr2 is stored in the ferroelectric tunnel insulation layer F, positive charges Fh are arranged in an inner region of the ferroelectric tunnel insulation layer F adjacent to the interface between the ferroelectric tunnel insulation layer F and the first electrode M1, even if no voltage is externally applied. In addition, the negative charges Fe are arranged in the inner region of the ferroelectric tunnel insulation layer F adjacent to the interface between the ferroelectric tunnel insulation layer F and the second electrode M2, even in the absence of an externally applied voltage.

Figure 17B:
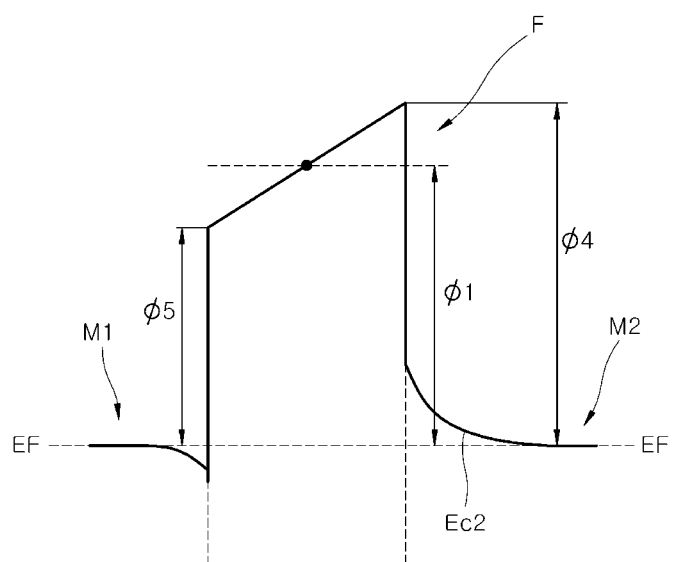

Referring to FIG. 17B, when the arrangement of the positive charges Fh and negative charges Fe shown in FIG. 17A exists, the interface barrier energy of the ferroelectric tunnel insulation layer F and the second electrode M2, based on electrons, can be increased from the first barrier energy $\Phi 1$ to a fourth barrier energy $\Phi 4$. When no external voltage is applied to the tunnel junction device, the first electrode M1 and the second electrode M2 have the same fermi level energies EF. Conduction band energy Ec2 of the second electrode M2 is disposed above the fermi level energy EF of the second electrode M2 near the interface between the ferroelectric tunnel insulation layer F and the second electrode M2. That is, electron densities of the second electrode M2 near the interface may decrease, compared with electron densities in the bulk area of the second electrode M2. On the other hand, the interface barrier energy of the ferroelectric tunnel insulation layer F and the first electrode M1, based on electrons, may be decreased from the first barrier energy $\Phi 1$ to a fifth barrier energy $\Phi 5$. The probability of electrons moving from the second electrode M2 to the ferroelectric tunnel insulation layer F by overcoming the fourth barrier energy $\Phi 4$ may be lowered consistent with the changes to the interfacial barrier energies. With the negative charges Fe arranged in the inner region of the ferroelectric tunnel insulation layer F adjacent to the second electrode M2, as illustrated in FIG. 17B the density of the electrons in the second electrode M2 adjacent to the ferroelectric tunnel insulation layer F can be decreased. As a result, the probability that the electrons tunnel from the second electrode M2 to the ferroelectric tunnel insulation layer F and then on to first electrode M1 may also be decreased.

In conclusion, when the second remanent polarization Pr2 is stored in the ferroelectric tunnel insulation layer F, the density of the electrons tunneling from the second electrode M2 to the first electrode M1 is reduced when a read voltage is applied to the tunnel junction device.

As described above, methods of driving the tunnel junction device can proceed by a method in which possible the remanent polarizations Pr1 and Pr2 are stored in a nonvolatile manner in the ferroelectric tunnel insulation layer F, and the remanent polarization Pr1 and Pr2 alters tunneling current from a first electrode to a second electrode depending on the orientation of the remanent polarization Pr1 and Pr2.

Figure 18A:
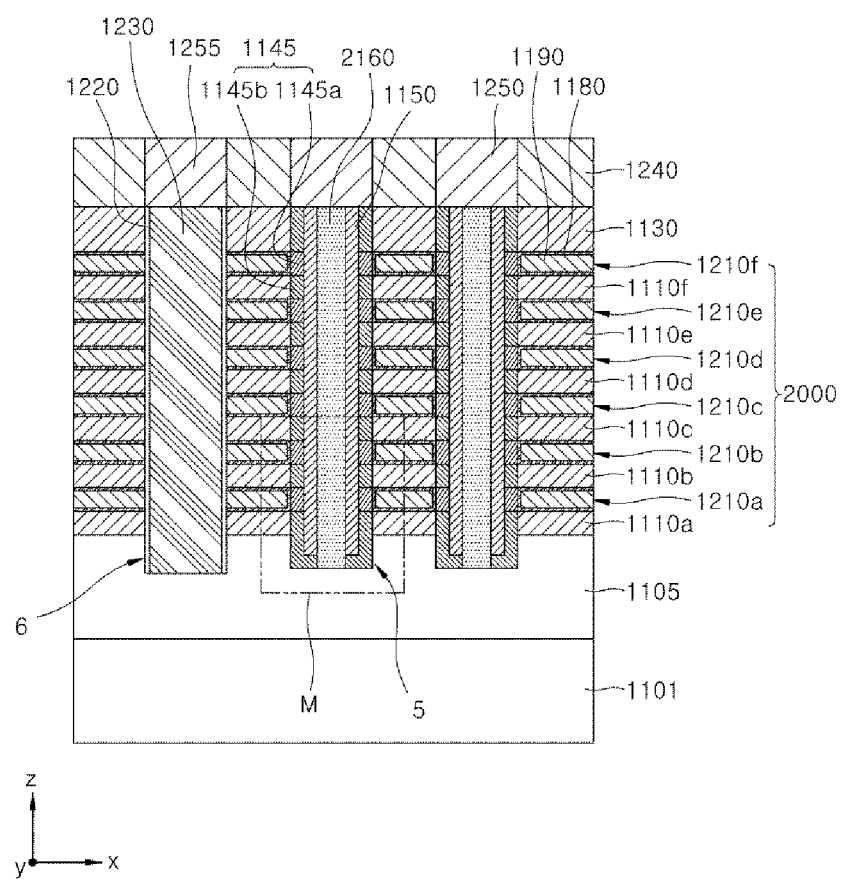
FIG. 18A is a view schematically illustrating a semiconductor device according to an embodiment of the present disclosure.
Figure 18B:
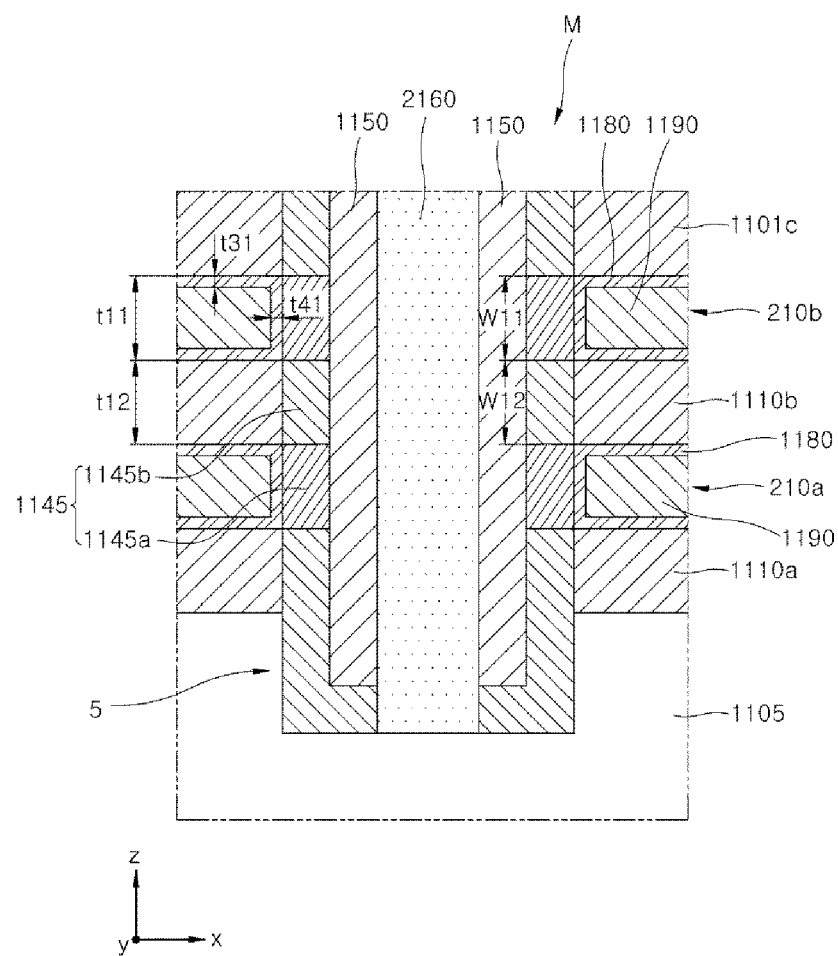
FIG. 18B is an enlarged view of region M of the semiconductor device shown in FIG. 18A.

FIG. 18A is a view schematically illustrating a semiconductor device according to an embodiment of the present disclosure and FIG. 18B is an enlarged view of region M of the semiconductor device illustrated in FIG. 18A. A semiconductor device 40 according to an embodiment may include a tunnel junction memory cell having a ferroelectric material layer as a tunnel insulation layer. In FIGS. 18A and 18B, each tunnel junction memory cell of the semiconductor device 40 may include a ferroelectric portion 1145a of a tunnel insulation layer 1145 located adjacent to an electrode, such as first electrodes 1210a, 1210b, 1210c, 1210d, 1210e or 1210f.

Referring to FIGS. 18A and 18B, the semiconductor device 40 may include a substrate 1101, a base conductive layer 1105 disposed on the substrate 1101, and an electrode stack 2000 disposed on the base conductive layer 1105. The semiconductor device 40 may further include a trench 5 that penetrates the electrode stack 2000 and extends into the base conductive layer 1105. A tunnel insulation layer 1145 and a second electrode 2160 may be disposed on a sidewall surface of the trench 5.

The substrate 1101 may be, for example, a semiconductor substrate. The semiconductor substrate may be, for example, a silicon (Si) substrate, a gallium arsenide (GaAs) substrate, an indium phosphide (InP) substrate, a germanium (Ge) substrate, or a silicon germanium (SiGe) substrate. The semiconductor substrate may be doped to have n-type conductivity or p-type conductivity. In another embodiment, the substrate 1101 may be an insulative substrate such as a silicon-on-insulator substrate. In yet another embodiment, the substrate 1101 may be a conductive substrate such as a metal substrate.

The base conductive layer 1105 may be disposed on the substrate 1101. The base conductive layer 1105 may include, for example, a doped semiconductor material, metal, conductive metal nitride or conductive metal silicide. As an example, the base conductive layer 1105 may include n-type doped silicon. As another example, the base conductive layer 1105 may include tungsten (W), titanium (Ti), copper (Cu), aluminum (Al), tungsten nitride, titanium nitride, tantalum nitride, tungsten silicide, titanium silicide, tantalum silicide or a combination of two or more thereof.

Although not illustrated, the substrate 1101 may include a well doped with an n-type or p-type dopant. Various types of semiconductor integrated circuits may be disposed between the substrate 1101 and the base conductive layer 1105. As an example, one or more conductive circuit pattern layers, and one or more insulating pattern layers for insulating the conductive circuit pattern layers, may be disposed between the substrate 1101 and the base conductive layer 1105.

The electrode stack 2000 may be disposed on the base conductive layer 1105. The electrode stack 2000 may include interlayer insulation layers 1110a, 1110b, 1110c, 1110d, 1110e and 1110f and first electrodes 1210a, 1210b, 1210c, 1210d, 1210e and 1210f. The interlayer insulation layers 1110a, 1110b, 1110c, 1110d, 1110e and 1110f, and first electrodes 1210a, 1210b, 1210c, 1210d, 1210e and 1210f may be alternately stacked or interleaved on base conductive layer 1105.

Each of the interlayer insulation layers 1110a, 1110b, 1110c, 1110d, 1110e and 1110f may include, for example, silicon oxide, silicon nitride, or silicon oxynitride. The first electrodes 1210a, 1210b, 1210c, 1210d, 1210e and 1210f may be disposed or layered to fill spaces between the vertically neighboring interlayer insulation layers 1110a, 1110b, 1110c, 1110d, 1110e and 1110f as illustrated in FIG. 18A.

As shown in FIG. 18B, in an embodiment, each of the first electrodes 1210a, 1210b, 1210c, 1210d, 1210e and 1210f may include a crystallization seed layer 1180 and a first electrode material layer 1190. The crystallization seed layer 1180 may be disposed adjacent to the interlayer insulation layers 1110a, 1110b, 1110c, 1110d, 1110e and 1110f and located adjacent or juxtaposed to a ferroelectric portion 1145a of the tunnel insulation layer 1145. The first electrode material layer 1190 may be disposed on or enveloped by the crystallization seed layers 1180 of each of the first electrodes 1210a, 1210b, 1210c, 1210d, 1210e and 1210f, and may fill spaces within the crystallization seed layers 1180 disposed between the interlayer insulation layers 1110a, 1110b, 1110c, 1110d, 1110e and 1110f.

As illustrated in FIG. 18B, each of the first electrode 1210a, 1210b, 1210c, 1210d, 1210e and 1210f may have a thickness t11 of, for example, 5 to 20 nanometers (nm). Each of the interlayer insulation layers 1110a, 1110b, 1110c, 1110d, 1110e and 1110f may have a thickness t12 of, for example, 2 to 20 nanometers (nm).

In an embodiment, the tunnel insulation layer 1145 may include a ferroelectric portion 1145a and a non-ferroelectric portion 1145b. The ferroelectric portion 1145a and the non-ferroelectric portion 1145b may be different portions of the tunnel insulation layer 1145. The crystallization seed layer 1180 may be disposed or arranged to be in contact with the ferroelectric portion 1145a of the tunnel insulation layer 1145 in a lateral or horizontal direction. The crystallization seed layer 1180 can induce a portion of the amorphous ferroelectric material in the ferroelectric portion 1145a, which is in contact with the crystallization seed layer 1180, to be converted into a crystalline ferroelectric layer.

The crystallization seed layer 1180 may include a crystalline conductive material. The crystallization seed layer 1180 may include, for example, titanium nitride (TiN), tantalum nitride (TaN), iridium oxide (IrO2), polysilicon or a combination of two or more thereof. In an embodiment, the crystallization seed layer 1180 may have a crystallographic preferred orientation surface. As an example, the crystallization seed layer 1180 may have a preferred orientation surface (using Miller indices, for example) of (100), (110) or (111). As illustrated in FIG. 18B, the thickness t31 of the crystallization seed layer 1180 in a vertical direction (i.e., the z-direction) and the thickness t41 of the crystallization seed layer 1180 in a lateral direction (i.e., the x-direction) may each be 2 to 5 nanometers (nm).

The first electrode material layer 1190 may have lower electrical resistance than the crystallization seed layer 1180. The first electrode material layer 1190 may include, for example, tungsten (W), molybdenum (Mo), cobalt (Co), ruthenium (Ru), or a combination thereof.

Referring to FIGS. 18A and 18B, the semiconductor device 40 may have a first trench 5 that penetrates through the electrode stack 2000 and reaches the base conductive layer 1105. In addition, the semiconductor device 40 may include the tunnel insulation layer 1145 and a selection device layer 1150 that are sequentially disposed along a sidewall surface of the first trench 5.

The tunnel insulation layer 1145 may include a ferroelectric portion 1145a and a non-ferroelectric portion 1145b. The ferroelectric portions 1145a may be disposed to be in contact the first electrodes 1210a, 1210b, 1210c, 1210d, 1210e and 1210f, and the non-ferroelectric portions 1145b may be disposed to be in contact the interlayer insulation layers 1110a, 1110b, 1110c, 1110d, 1110e and 1110f. As illustrated, the ferroelectric portions 1145a and the non-ferroelectric portions 1145b may alternate along the direction perpendicular to the substrate 1101 (i.e., the z-direction). That is, the ferroelectric portions 1145a in tunnel insulation layer 1145 may be discontinuously located in tunnel insulation layer 1145 along the z-direction.

The ferroelectric portion 1145a is a region of the tunnel insulation layer 1145, which has predetermined remanent polarization. The remanent polarization can be set according to a write voltage applied through the first electrode 1210a, 1210b, 1210c, 1210d, 1210e or 1210f. The remanent polarization of a ferroelectric portion 1145a can be stored in a non-volatile manner therein.

As described above, the ferroelectric portion 1145a may be produced by crystallizing a ferroelectric material layer using the crystallization seed layer 1180 in a process of manufacturing the semiconductor device 40. Accordingly, the ferroelectric portion 1145a may have a width W11 of 5 to 20 nanometers (nm) in the vertical direction (i.e., the z-direction) corresponding to the thickness t11 of the first electrodes 1210a, 1210b, 1210c, 1210d, 1210e and 1210f, and the non-ferroelectric portion 1145b may have a width W12 of 2 to 20 nanometers (nm) in the vertical direction (i.e., the z-direction) corresponding to the thickness t12 of the interlayer insulation layers 1110a, 1110b, 1110c, 1110d, 1110e and 1110f.

The tunnel insulation layer 1145 may include, for example, hafnium oxide, zirconium oxide, hafnium zirconium oxide or a combination thereof. The tunnel insulation layer 1145 may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof.

The tunnel insulation layer 1145 may have a crystalline phase. However, the ferroelectric portion 1145a and the non-ferroelectric portion 1145b may have different crystal structures from each other. As an example, the ferroelectric portion 1145a may have a crystal structure of an orthorhombic system, and the non-ferroelectric portion 1145b may have a crystal structure of a tetragonal system or a monoclinic system. The ferroelectric portion 1145a and the non-ferroelectric portion 1145b may each have a thickness of 5 to 15 nanometers (nm) in the lateral direction (i.e., the x-direction). In an embodiment, the ferroelectric portion 1145a may have a crystallographic preferred orientation surface. As an example, the ferroelectric portion 1145a may have a preferred orientation surface of (100), (110) or (111). The preferred orientation surface of the ferroelectric portion 1145a may be substantially the same as the preferred orientation surface of the crystallization seed layer 1180. On the other hand, the non-ferroelectric portion 1145b may or may not have a crystallographic preferred orientation surface. When the non-ferroelectric portion 1145b has a crystallographic preferred orientation surface, the preferred orientation surface of the non-ferroelectric portion 1145b may be different from the preferred orientation surface of the ferroelectric portion 1145a.

Referring to FIGS. 18A and 18B, the selection device layer 1150 may be disposed on or adjacent to the tunnel insulation layer 1145 along the sidewall surface of the first trench 5. The selection device layer 1150 may be, for example, a switching device layer having electrical volatility. The selection device layer 1150 may include, for example, metal doped silicon oxide, or metal doped transition metal oxide. The transition metal oxide may include, for example, aluminum oxide, tungsten oxide, zirconium oxide, hafnium oxide or the like. The metal doped in the silicon oxide or in the transition metal oxide may include, for example, copper (Cu), tungsten (W), niobium (Nb), titanium (Ti), aluminum (Al), nickel (Ni), zirconium (Zr), tantalum (Ta) or the like.

The electrical resistance to charges passing through the selection device layer 1150 may be relatively large when a voltage less than a predetermined threshold voltage is applied across the selection device layer 1150, and the electrical resistance to charges passing through the selection device layer 1150 may be relatively small when the voltage equal to or higher than the threshold voltage is applied. Accordingly, the selection device layer 1150 can suppress the leakage current flowing through the tunnel insulation layer 1145 when a voltage less than the predetermined threshold voltage is applied.

The second electrode 2160 may be disposed on the selection device layer 1150. The second electrode 2160 may include a conductive material. The conductive material may include, for example, tungsten (W), titanium (Ti), copper (Cu), aluminum (Al), tungsten nitride, titanium nitride, tantalum nitride, tungsten silicide, titanium silicide, tantalum silicide, or a combination of two or more thereof.

A first wiring layer 1250 may be disposed on the second electrode 2160. The first wiring layer 1250 may be electrically connected to a circuit pattern driving the semiconductor device 40. In an embodiment, the first wiring layer 1250 may have lower electrical resistance than the second electrode 2160.

The semiconductor device 40 may have a second trench 6 that penetrates through the electrode stack 2000 and reaches the base conductive layer 1105. The semiconductor device 40 may include spacer insulation layers 1220 disposed on an inner surface of the second trench 6, and a conductive connection pattern 1230 between the spacer insulation layers 1220 to fill the second trench 6. The conductive connection pattern 1230 may be electrically connected to the base conductive layer 1105 under the second trench 6. The conductive connection pattern 1230 may be electrically connected to the second electrode 2160 via the base conductive layer 1105. The conductive connection pattern 1230 may be electrically connected to a second wiring layer 1255 disposed on or above the conductive connection pattern 1230. The second wiring layer 1255 may be electrically connected to a circuit pattern driving the semiconductor device 40. In an embodiment, the second wiring layer 1255 may have lower electrical resistance than the conductive connection pattern 1230.

The first wiring layer 1250 and the second wiring layer 1255 may be electrically insulated from each other on the electrode stack structure 2000 in a lateral direction by a second upper insulation layer 1240.

In some embodiments, when the substrate 1101 is a conductor or is highly doped with a dopant to have conductivity, the base conductive layer 1105 can be omitted. In this case, the first and second trenches 5 and 6 may be formed to expose or extend into the substrate 1101. The conductive connection pattern 1230 may be electrically connected to the second electrode 2160 via the substrate 1101.

According to another embodiment, in the first electrode 1210a, 1210b, 1210c, 1210d, 1210e and 1210f, the crystallization seed layer 1180 may perform a function of the first electrode material layer 1190. In this case, the first electrodes 1210a, 1210b, 1210c, 1210d, 1210e and 1210f may each be formed of a single crystallization seed layer 1180 without a first electrode material layer 1190. That is, the crystallization seed layer 1180 may be disposed to fill spaces between the neighboring interlayer insulation layers 1110a, 1110b, 1110c, 1110d, 1110e and 1110f.

According to embodiments of the present disclosure described above, there is provided an electrode stack having interlayer insulation layers and first electrodes that are alternately stacked or alternately disposed on a substrate. Here, portions of a tunnel insulation layer in contact with first electrodes may be used as ferroelectric portions and portions of the tunnel insulation layer in contact with the interlayer insulation layer may be substantially non-ferroelectric portions. Only the ferroelectric portions function as memory elements for storing remanent polarization, while the non-ferroelectric portions separate the different ferroelectric portions from each other, thereby effectively suppressing the polarization interference among neighboring tunnel junction memory cells. As a result, the operational reliability of the tunnel junction memory cells stacked in a three-dimensional structure can be improved.

FIG. 19 is a flow chart schematically illustrating a method of manufacturing a semiconductor device according to another embodiment of the present disclosure.

Referring to FIG. 19, in operation S210, a stack structure is formed on a substrate. Here, the stack structure includes interlayer insulation layers and interlayer sacrificial layers alternately stacked. The interlayer insulation layers and the interlayer sacrificial layers may have etching selectivity with respect to each other.

In operation S220, a trench penetrating the inside of the stack structure on the substrate is formed. The side surfaces of the interlayer insulating layers and interlayer sacrificial layers may be exposed on the sidewall surface of the trench.

In operation S230, an amorphous tunnel material layer is formed on a sidewall surface of the trench. The tunnel material layer may include, for example, hafnium oxide, zirconium oxide, hafnium zirconium oxide, or a combination of two or more thereof. In an embodiment, the tunnel material layer may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof.

In operation S240, a selection device layer is formed on the amorphous tunnel material layer. The selection device layer may include, for example, metal doped silicon oxide or metal doped transition metal oxide. The transition metal oxide may include, for example, aluminum oxide, tungsten oxide, zirconium oxide, hafnium oxide or the like. The metal doped in the silicon oxide or in the transition metal oxide may include, for example, copper (Cu), tungsten (W), niobium (Nb), titanium (Ti), aluminum (Al), nickel (Ni), zirconium (Zr), tantalum (Ta) or the like.

In operation S250, the interlayer sacrificial layers are selectively removed to form recesses selectively exposing the amorphous tunnel material layer. In an embodiment, the recesses may be formed by forming a second trench that penetrates the stack structure on the substrate, and providing an etchant that selectively removes the interlayer sacrificial layers, including those common to the second trench.

In operation S260, a crystallization seed layer is formed, in the recesses resulting from the selective etching of the interlayer sacrificial layers, common to the amorphous tunnel material layer and the interlayer insulation layers. The crystallization seed layer may include at least one of titanium nitride (TiN), tantalum nitride (TaN), iridium oxide (IrO2) and polysilicon.

In operation S270, a crystallization heat treatment is performed with respect to the amorphous tunnel material layer using the crystallization seed layer. In an embodiment, the crystallization heat treatment results in crystallizing portions of the amorphous tunnel material layer in contact with the crystallization seed layers to form predetermined crystal structures having ferroelectricity, and crystallizing portions of the amorphous tunnel material layer in contact with the interlayer insulation layers to form a predetermined crystal structure having non-ferroelectric characteristics. In other words, when the amorphous ferroelectric material layer is crystallized by the crystallization heat treatment, the crystallization seed layer induces differentiated ferroelectric crystal structures in the crystallized ferroelectric material layer. As an example, after the amorphous ferroelectric material layer is crystallized, the portion having ferroelectricity may have a crystal structure of an orthorhombic system, and the portion having non-ferroelectricity may have a crystal structure of a tetragonal system or a monoclinic system.

Although not illustrated in FIG. 19, after performing operation S270, an electrode material layer may further be formed on the crystallization seed layer and in the recesses resulting from the selective etching of the interlayer sacrificial layers. The electrode material layer may constitute the first electrode with the crystallization seed layer. Alternatively, before performing operation S270, the electrode material layer may be formed on the crystallization seed layer. Next, the crystallization heat treatment may be performed. The electrode material layer may include, for example, tungsten (W), molybdenum (Mo), cobalt (Co), ruthenium (Ru), or a combination of two or more thereof.

According to an embodiment, after performing operation S270, a second electrode may be formed on the crystallized selection device layer. The second electrode may include a conductive material layer. The conductive material layer may include, for example, tungsten (W), titanium (Ti), copper (Cu), aluminum (Al), tungsten nitride, titanium nitride, tantalum nitride, tungsten silicide, titanium silicide, tantalum silicide, or a combination of two or more thereof.

The semiconductor device according to an embodiment of the present disclosure can be manufactured through the above-described process. Hereinafter, a method of manufacturing a semiconductor device according to an embodiment will be described with reference to drawings showing respective steps of the manufacturing process.

FIGS. 20 to 27 are cross-sectional views illustrating a method of manufacturing a semiconductor device according to an embodiment of the present disclosure.

Figure 20:
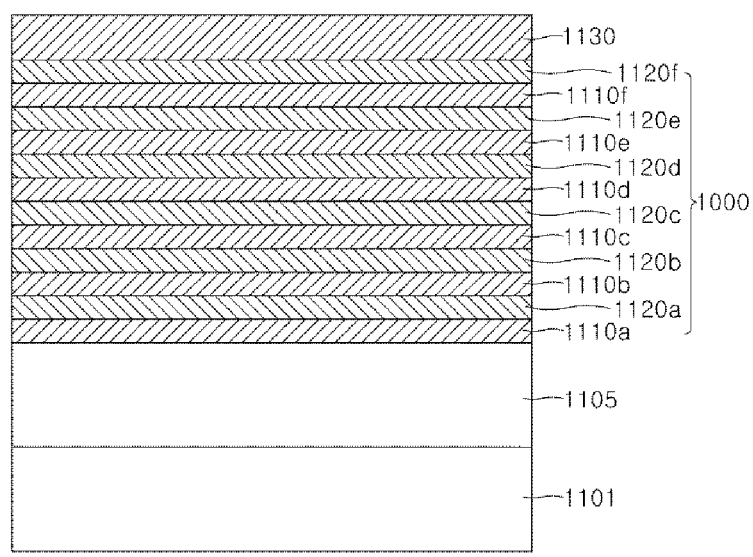
FIGS. 20 to 27 are cross-sectional views illustrating a method of manufacturing a semiconductor device according to an embodiment of the present disclosure.

Referring to FIG. 20, a substrate 1101 may be prepared. In an embodiment, the substrate 1101 may be a semiconductor substrate. A base conductive layer 1105 may be formed on the substrate 1101. A stack structure 1000 may be formed on the base conductive layer 1105. The stack structure 1000 may be formed by alternately stacking interlayer insulation layers 1110a, 1110b, 1110c, 1110d, 1110e and 1110f and interlayer sacrificial layers 1120a, 1120b, 1120c, 1120d, 1120e and 1120f. A first upper insulation layer 1130 may be formed on the uppermost interlayer sacrificial layer 1120f of the stack structure 1000.

The configuration and forming method of the substrate 1101, the base conductive layer 1105, the stack structure 1000 and the first upper insulation layer 1130 may be substantially the same as the configuration and forming method of the substrate 101, the base conductive layer 105, the stack structure 100 and the first upper insulation layer 130 of the embodiment described above and with reference to FIG. 4, and will not be repeated here.

Figure 21:
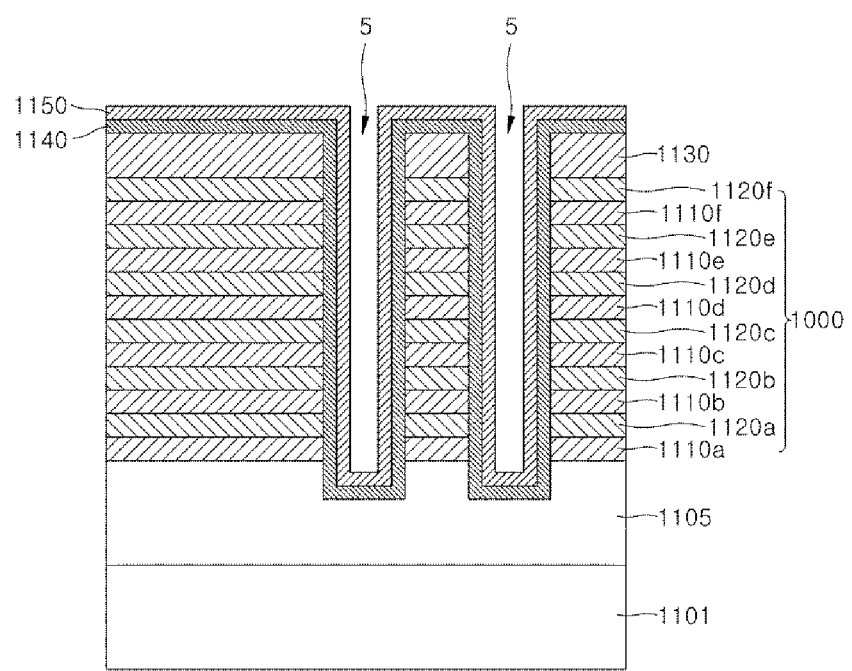

Referring to FIG. 21, a first trench 5 may be formed to penetrate through the stack structure 1000 and the first upper insulation layer 1130 and to expose a portion of the base conductive layer 1105. The configuration and forming method of the trench 5 may be substantially the same as the configuration and forming method of the trench 1 of the embodiment described above with reference to FIG. 5.

Subsequently, a tunnel material layer 1140 and a selection device layer 1150 may be sequentially formed on an inner wall surface of the first trench 5 and on the first upper insulation layer 1130 outside the first trench 5. The tunnel material layer 1140 may be formed as an amorphous ferroelectric material layer on the inner wall surface of the first trench 5 and on the first upper insulation layer 1130. The ferroelectric material layer may include, for example, hafnium oxide, zirconium oxide, hafnium zirconium oxide or a combination thereof. In an embodiment, the ferroelectric material layer 1140 may include a dopant. The dopant may include, for example, carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), or a combination of two or more thereof. The tunnel material layer 1140 may be formed by using, for example, an atomic layer deposition method, a chemical vapor deposition method or the like. The tunnel material layer 1140 may be formed in a thickness of, for example, 5 to 15 nanometers (nm).

The selection device layer 1150 may include, for example, metal doped silicon oxide or metal doped transition metal oxide. The transition metal oxide may include, for example, aluminum oxide, tungsten oxide, zirconium oxide, hafnium oxide or the like. The metal doped in the silicon oxide or in the transition metal oxide may include, for example, copper (Cu), tungsten (W), niobium (Nb), titanium (Ti), aluminum (Al), nickel (Ni), zirconium (Zr), tantalum (Ta) or the like. The selection device layer 1150 may be formed by utilizing, for example, a chemical vapor deposition method, an atomic layer deposition method or the like.

Figure 22:
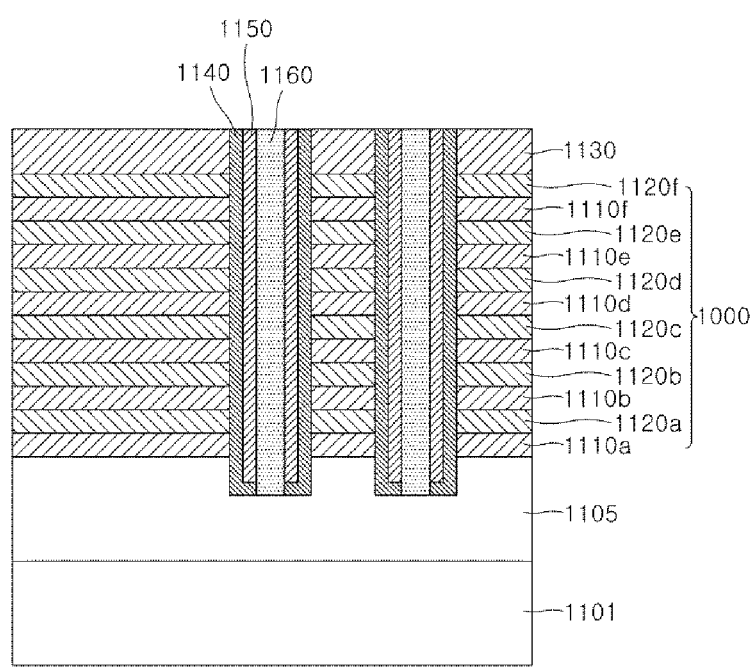

Referring to FIGS. 21 and 22, the tunnel material layer 1140 and the selection device layer 1150 may be anisotropically etched to remove the tunnel material layer 1140 and the selection device layer 1150 formed on the bottom surface of the first trench 5 and on the upper surface of the first upper insulation layer 1130. In an embodiment, the anisotropic etching may be performed by a dry etch method. In another embodiment, the anisotropic etching may be performed by an etch-back method. As a result of the anisotropic etching, the base conductive layer 1105 under the first trench 5 may be exposed at the bottom of the first trench 5, and the tunnel material layer 1140 and the selection device layer 1150 formed on the upper surface of the first upper insulation layer 1130 may be removed.

Referring to FIG. 22, the first trench 5 may be filled with a filling material layer 1160. The configuration and forming method of the filling material layer 1160 may be substantially the same as the configuration and forming method of the filling material layer 160 of the embodiment described above and with reference to FIG. 8.

Figure 23:
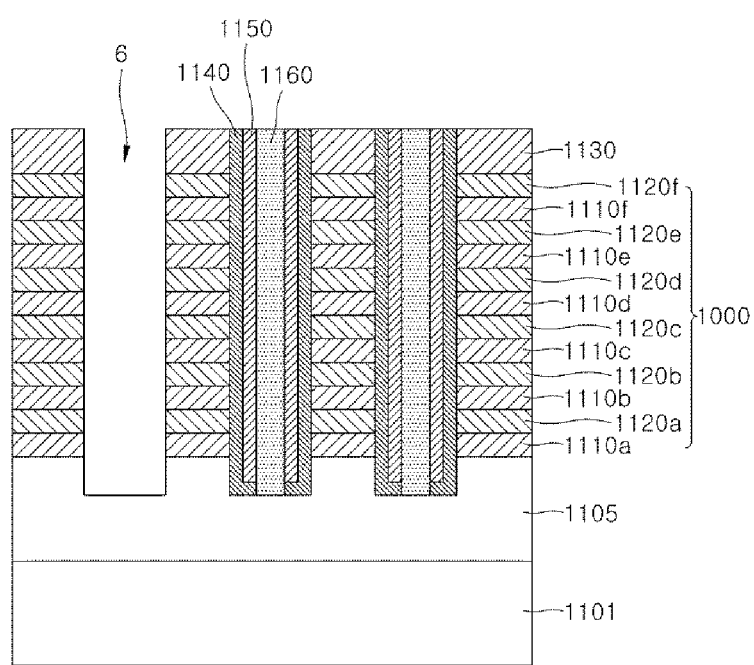

Referring to FIG. 23, a second trench 6 that penetrates the stack structure 1000 and that selectively exposes the base conductive layer 1105 may be formed. The configuration and forming method of the second trench 6 may be substantially the same as the configuration and forming method of the second trench 2 of the embodiment described above and with reference to FIG. 9.

Figure 24:
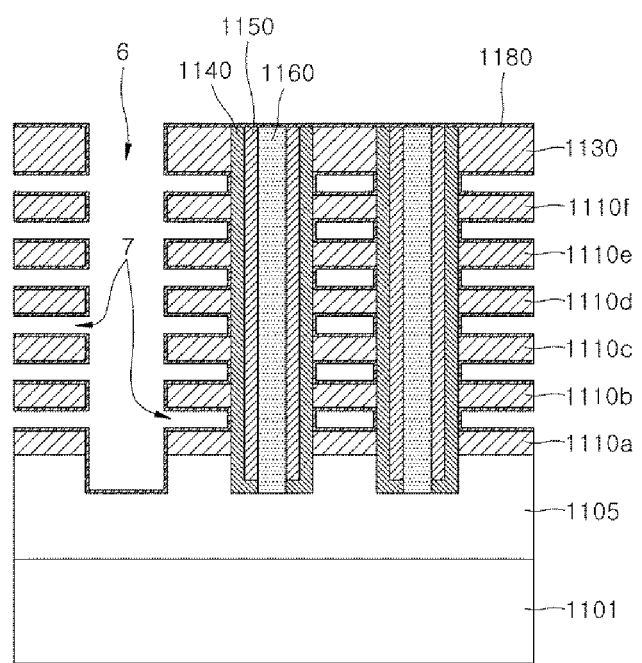

Referring to FIG. 24, the interlayer sacrificial layers 1120a, 1120b, 1120c, 1120d, 1120e and 1120f of the stack structure 1000 may be selectively removed to form recesses 7 and to leave the interlayer insulation layers 1110a, 1110b, 1110c, 1110d, 1110e and 1110f. In an embodiment, the process of selectively removing the interlayer sacrificial layers 1120a, 1120b, 1120c, 1120d, 1120e and 1120f may be the same as the process of selectively removing the interlayer sacrificial layers 120a, 120b, 120c, 120d, 120e and 120f of the embodiment described above and with reference to FIG. 10.

Subsequently, a crystallization seed layer 1180 may be formed on exposed portions of the tunnel material layer 1140 and the interlayer insulation layers 1110a, 1110b, 1110c, 1110d, 1110e and 1110f. The configuration and forming method of the crystallization seed layer 1180 may be substantially the same as the configuration and forming method of the crystallization seed layer 180 of the embodiment described above and with reference to FIG. 11.

Subsequently, crystallization heat treatment may be performed with respect to the tunnel material layer 1140 using the crystallization seed layer 1180. The crystallization heat treatment may be performed at a temperature of 400 to 1000° C. and in an oxygen atmosphere or in an inert gas atmosphere. The inert gas atmosphere may be a nitrogen atmosphere or an argon atmosphere. Through the crystallization heat treatment, as illustrated in FIG. 24, portions of the tunnel material layer 1140 can develop ferroelectric properties.

Figure 25:
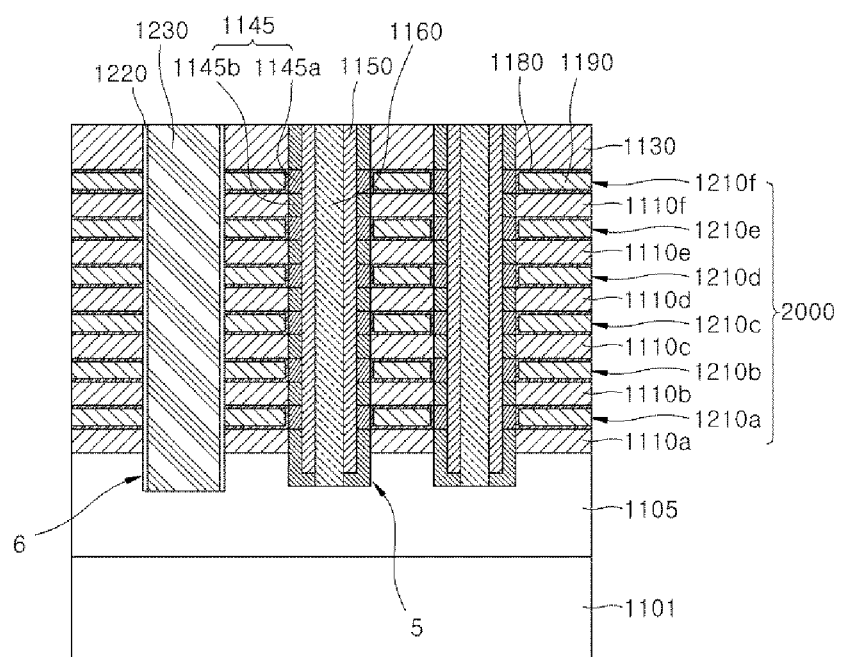

Referring to FIG. 25, after the crystallization heat treatment, the tunnel material layer 1140 can be converted into the tunnel insulation layer 1145 having ferroelectric portions 1145a and non-ferroelectric portions 1145b. The ferroelectric portions 1145a are portions in contact with the crystallization seed layers 1180, and may have a predetermined crystal structure having ferroelectric properties. The non-ferroelectric portions 1145b are portions in contact with the interlayer insulation layers 1110a, 1110b, 1110c, 1110d, 1110e and 1110f and may have a crystal structure that does not exhibit ferroelectric characteristics. As an example, when the tunnel material layer 1140 includes at least one of hafnium oxide, zirconium oxide, and hafnium zirconium oxide, the ferroelectric portion 1145a may have a crystal structure of an orthorhombic system and the non-ferroelectric portion 1145b may have a crystal structure of a tetragonal system or a monoclinic system.

Subsequently, the recesses 7 and the second trench 6, in which the crystallization seed layer 1180 is formed, may be filled with a conductive material layer to form a first electrode material layer 1190. The first electrode material layer 1190 may include, for example, tungsten (W), molybdenum (Mo), cobalt (Co), ruthenium (Ru), or a combination thereof. After forming the first electrode material layer 1190, a planarization process with respect to the first electrode material layer 1190 may be additionally performed.

Referring to FIG. 25, after selectively removing the crystallization seed layer 1180 and the first electrode material layer 1190 formed inside the second trench 6, a spacer insulation layer 1220 and a conductive connection pattern 1230 may be formed in the second trench 6. The process of selectively removing the crystallization seed layer 1180 and the first electrode material layer 1190, and the process of forming the spacer insulation layer 1220 and the conductive connection pattern 1230, may be substantially the same as the process of selectively removing the crystallization seed layer 180 and the gate electrode layer 190 and the process of forming the spacer insulation layer 220 and the first source line connection pattern 230 in the embodiment described above and with reference to FIGS. 12 and 13.

Figure 26:
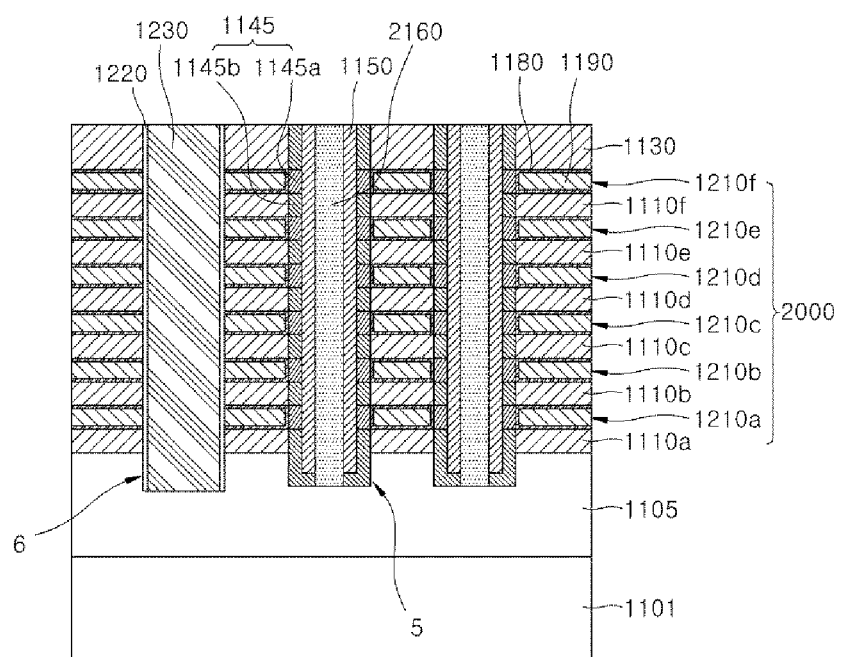

Referring to FIG. 26, the filling material layer 1160 inside the first trench 5 may be selectively removed. The filling material layer 1160 inside the first trench 5 may be removed by applying an isotropic etching method or an anisotropic etching method. Next, the space in which the filling insulation layer 1160 is removed may be filled with a conductive material layer to form a second electrode 2160. In an embodiment, the second electrode 2160 may be formed to contact the selection device layer 1150. The first trench 5 may be filled by using, for example, a chemical vapor deposition method, a coating method or the like. The conductive material layer may include, for example, tungsten (W), titanium (Ti), copper (Cu), aluminum (Al), tungsten nitride, titanium nitride, tantalum nitride, tungsten silicide, titanium silicide, tantalum silicide, or a combination of two or more thereof. The conductive material layer formed outside the first trench 5 may be removed by a further planarization process.

Figure 27:
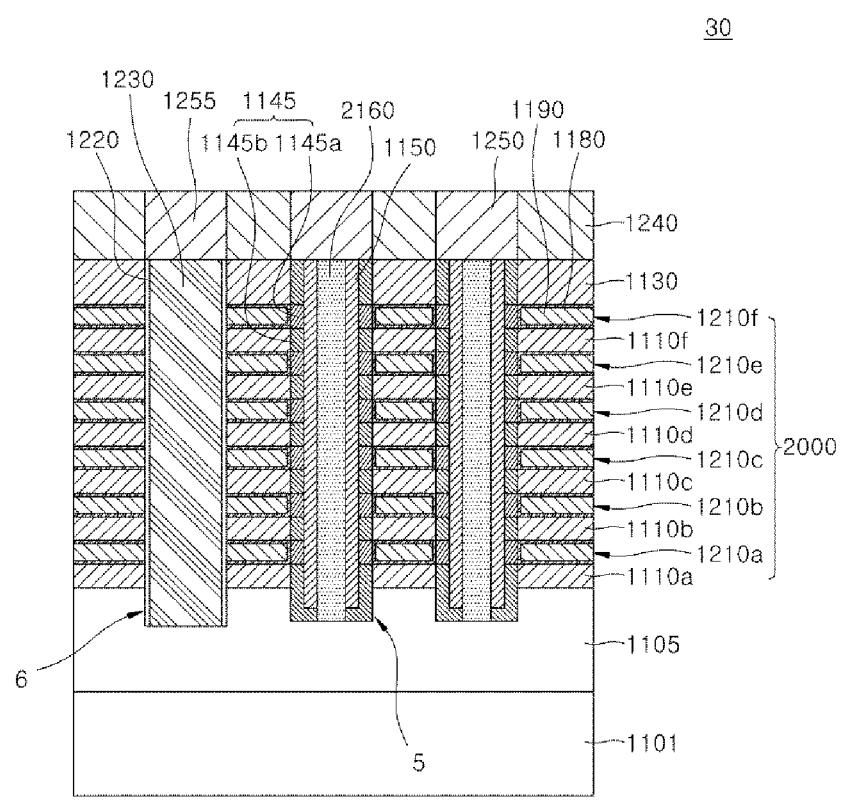

Referring to FIG. 27, a second upper insulation layer 1240 may be formed on the first upper insulation layer 1130. In addition, a first wiring layer 1250 may be formed on the second electrode 2160. Similarly, a second wiring layer 1255 may be formed on the conductive connection pattern 1230. The first wiring layer 1250 and the second wiring layer 1255 may be electrically insulated from each other by the second upper insulation layer 1240.

The configuration and forming method of the second upper insulation layer 1240, the first wiring layer 1250 and the second wiring layer 1255 may be substantially the same as the configuration and forming method of the second upper insulation layer 240, the bit line connection pattern 250 and the second source line connection pattern 255 of the embodiment described above and with reference to FIG. 14.

By performing the above-described processes, semiconductor devices according to embodiments of the present disclosure can be manufactured. In other embodiments, the crystallization heat treatment proceeding using the crystallization seed layer 1180, described above in connection with FIGS. 24 and 25, may be performed with respect to the amorphous tunnel material layer 1140 after forming the first electrode material layer 1190 shown in FIG. 25.

According to yet other embodiments, when the substrate 1101 is a conductor or is doped with a high concentration of dopant to have conductivity, the base conductive layer 1105 can be omitted. In this case, the first and second trenches 5 and 6 may be formed to expose the substrate 1101.

According to further embodiments, in the first electrodes 1210a, 1210b, 1210c, 1210d, 1210e and 1210f, the crystallization seed layer 1180 can perform the function of the first electrode material layer 1190. In such cases, the first electrodes 1210a, 1210b, 1210c, 1210d, 1210e and 1210f may be formed of uniform crystallization seed layers 1180 without the first electrode material layers 1190. In other words, in the process of forming the crystallization seed layers 1180, the crystallization seed layers 1180 may be formed to fill spaces between the neighboring interlayer insulating layers 1110a, 1110b, 1110c, 1110d, 1110e and 1110f.

As described above, embodiments of the present disclosure can provide methods of manufacturing a three-dimensional semiconductor device that uses the ferroelectric portion 1145a of the tunnel insulation layer 1145 as a memory layer. When fabricating the ferroelectric portion 1145a, a crystallization seed layer 1180 that contacts a segment or region of the amorphous tunnel material layer 1140 can induce only that portion of tunnel material layer 1140 to have a crystal structure that supports ferroelectricity.

By adopting the above-described methods, the ferroelectric portions 1145a and the non-ferroelectric portions 1145b can be formed and alternate in the direction perpendicular to the substrate. The polarization interference generated among neighboring memory cells can be effectively suppressed when voltage is applied to the first electrode material layers 1190, as compared with a case in which the entire tunnel insulation layer 1145 has ferroelectricity. As a result, the operational reliability of the memory cell with the above-described three-dimensional structure can be improved.

In addition, according to embodiments of the present disclosure, the interval between the tunnel junction memory cells which are separated from each other in the vertical direction can be effectively controlled by controlling the thickness of the interlayer insulation layers 1110a, 1110b, 1110c, 1110d, 1110e and 1110f. As an example, the height of the interlayer insulation layer can be reduced to 5 to 20 nanometers (nm), thereby effectively improving the memory cell density of the semiconductor device.

Embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A semiconductor device comprising:
a substrate;
an electrode stack disposed on the substrate, the electrode stack including an interlayer insulation layer and a gate electrode structure that are alternately stacked in a direction perpendicular to the substrate;
a trench penetrating the electrode stack to expose sidewall surfaces of the interlayer insulation layer and the gate electrode structure;
a gate dielectric layer disposed along a sidewall surface of the trench, the gate dielectric layer including a ferroelectric portion and a non-ferroelectric portion; and
a channel layer disposed adjacent to the gate dielectric layer,
wherein the ferroelectric portion is in contact with the gate electrode structure and the non-ferroelectric portion is in contact with the interlayer insulation layer, wherein the gate electrode structure comprises:
a crystallization seed layer disposed to be in contact with the ferroelectric portion of the gate dielectric layer; and
a gate electrode layer disposed to be in contact with the crystallization seed layer.

2. The semiconductor device of claim 1,
wherein the ferroelectric portion is disposed discontinuously in the gate dielectric layer along the direction perpendicular to the substrate.

3. The semiconductor device of claim 1,
wherein the gate dielectric layer comprises at least one of hafnium oxide, zirconium oxide, and hafnium zirconium oxide.

4. The semiconductor device of claim 1,
wherein the ferroelectric portion and the non-ferroelectric portion have different crystal structures.

5. The semiconductor device of claim 1,
wherein
the crystallization seed layer includes a crystalline conductive material and has a predetermined crystallographic preferred orientation surface; and
the gate electrode layer has lower electrical resistance than the crystallization seed layer.

6. The semiconductor device of claim 1,
wherein the crystallization seed layer comprises at least one of titanium nitride (TiN), tantalum nitride (TaN), iridium oxide (IrO2) and polysilicon.

7. The semiconductor device of claim 1,
wherein the gate electrode layer comprises at least one of tungsten (W), molybdenum (Mo), cobalt (Co), and ruthenium (Ru).

* * * * *